(12) United States Patent
Stoddard et al.

(10) Patent No.: US 6,222,164 B1
(45) Date of Patent: Apr. 24, 2001

(54) TEMPERATURE CONTROL SYSTEM FOR A THERMAL REACTOR

(75) Inventors: Kevin Stoddard, Scottsdale, AZ (US);
Paul R. McHugh, Kalispell, MT (US);
Konstantinos Tsakalis, Chandler, AZ (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/387,001

(22) Filed: Aug. 31, 1999

Related U.S. Application Data

(63) Continuation of application No. PCT/US99/10329, filed on May 11, 1999.
(60) Provisional application No. 60/084,907, filed on May 11, 1998, provisional application No. 60/084,909, filed on May 11, 1998, provisional application No. 60/085,257, filed on May 13, 1998, and provisional application No. 60/086,932, filed on May 27, 1998.

(51) Int. Cl.$^7$ ...................................................... H05B 1/02
(52) U.S. Cl. ........................ 219/497; 219/486; 219/481; 219/501; 392/416
(58) Field of Search .................................. 219/497, 499, 219/501, 505, 508, 481, 490, 483–486; 392/416

(56) References Cited

U.S. PATENT DOCUMENTS

| | | | |
|---|---|---|---|
| 4,496,940 | * 1/1985 | Christel, Jr. ........................ | 340/640 |
| 4,570,054 | 2/1986 | Chidzey et al. .................... | 219/490 |
| 4,937,434 | 6/1990 | Nako ................................. | 219/390 |
| 5,001,327 | 3/1991 | Hirasawa et al. ................... | 219/390 |
| 5,270,520 | * 12/1993 | Barzilai et al. ..................... | 219/501 |
| 5,280,422 | 1/1994 | Moe et al. .......................... | 364/140 |
| 5,340,964 | 8/1994 | Galloway ........................... | 219/490 |
| 5,378,874 | * 1/1995 | Holling et al. ..................... | 219/506 |
| 5,436,172 | 7/1995 | Moslehi .............................. | 437/8 |
| 5,442,157 | 8/1995 | Jackson .............................. | 219/492 |

(List continued on next page.)

FOREIGN PATENT DOCUMENTS

| | | |
|---|---|---|
| WO 98/39793 | 2/1998 | (WO) . |
| WO 99/59196 A1 | 5/1999 | (WO) . |

OTHER PUBLICATIONS

Semithern, *Trends in Vertical Diffusion Furnaces*, Semiconductor International 57 (Apr. 1986); 5 pages.

*Primary Examiner*—Mark Paschall
(74) *Attorney, Agent, or Firm*—Lyon & Lyon LLP

(57) ABSTRACT

A temperature control system for a thermal reactor is disclosed that addresses many of the problems in the art. In accordance with one aspect of the disclosed control system, a plurality of temperature controllers are employed. Each temperature controller employs one or more dynamic models that are optimized for a given temperature range. The temperature range over which a particular controller is optimized is preferably generally exclusive of the temperature ranges over which other controllers of the plurality of temperature controllers are optimized. In accordance with another aspect of the control system the control system employs enhanced ramp trajectory logic. In accordance with another aspect of the control system, the control system employs a virtual temperature sensor in the event of a hardware failure of the corresponding non-virtual temperature sensor. Upon the detection of a failure of the non-virtual temperature sensor, the temperature control system automatically substitutes a virtual temperature sensor in its place as a control system input. In accordance with a still further aspect of the temperature control system, the control system is provided with control logic that switches the control mode of the system in the event of a failure of a heating element. All of the foregoing aspect of the present invention may be combined into a single temperature controller. Alternatively, these temperature control system improvements may be incorporated as individual elements, without reliance on the other inventive aspects disclosed herein.

4 Claims, 17 Drawing Sheets

U.S. PATENT DOCUMENTS

| | | | |
|---|---|---|---|
| 5,517,549 | 5/1996 | Shah et al. | 392/416 |
| 5,555,725 | 9/1996 | Shimasaki et al. | 60/277 |
| 5,616,264 | 4/1997 | Nishi et al. | 219/494 |
| 5,661,669 | 8/1997 | Mozumder et al. | 364/552 |
| 5,758,492 | 6/1998 | Kato et al. | 60/274 |
| 5,782,227 | 7/1998 | Abe | 123/689 |
| 5,895,596 | 4/1999 | Stoddard et al. | 219/497 |
| 5,900,117 | 5/1999 | Lecouras et al. | |
| 5,947,718 | 9/1999 | Weaver | 432/77 |
| 5,994,675 | 11/1999 | Bethune et al. | 219/483 |
| 5,998,767 | 12/1999 | Kersch et al. | |

\* cited by examiner

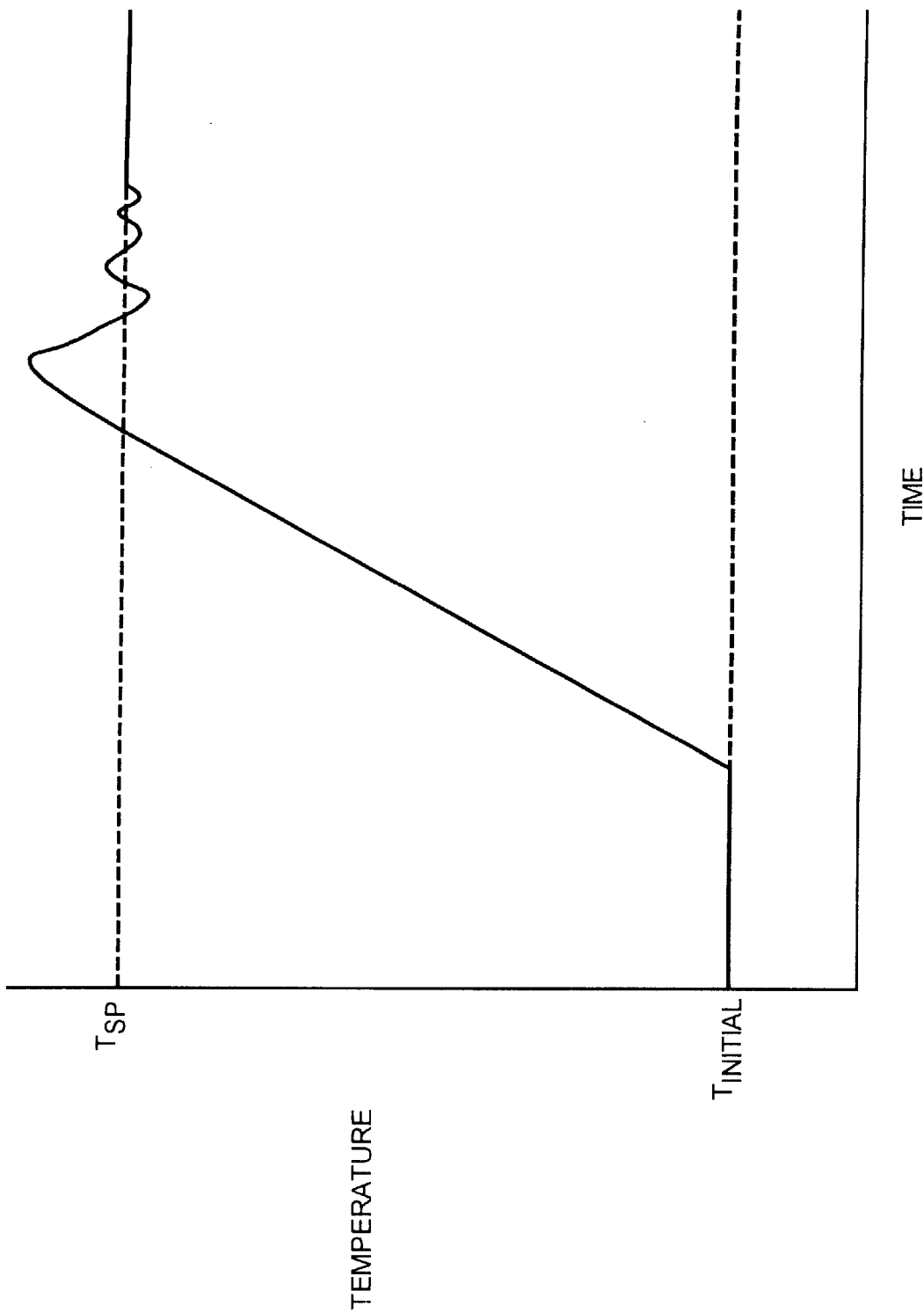

TEMPERATURE CONTROL SYSTEM FOR A THERMAL REACTOR

CROSS-REFERENCE TO RELATED APPLICATIONS

This is a continuation application of International PCT Patent Application No. PCT/US99/10329, designating the US, filed May 11, 1999, entitled TEMPERATURE CONTROL SYSTEM FOR A THERMAL REACTOR, which claims priority from U.S. patent application Ser. No. 60/084,907, filed May 11, 1998, U.S. patent application Ser. No. 60/084,909, filed May 11, 1998, U.S. patent application Ser. No. 60/085,257, filed May 13, 1998, and U.S. patent application Ser. No. 60/086,932, filed May 27, 1998.

STATEMENT REGARDING FEDERALLY SPONSORED RESEARCH OR DEVELOPMENT

Not Applicable

BACKGROUND OF THE INVENTION

The processing of semiconductor wafers and other microelectronic components has become of great economic significance due to the large volume of such circuits and components being produced and the significant value associated with them. Competitive pressures have driven dramatic changes in production. Among the most dramatic changes is the reduction in size of the various features of the circuits and components which make up the transistors and other devices being formed. This reduction in feature size has been driven by the need to achieve greater levels of integration, more sophisticated and complex circuits, and reduction in production costs by, for example, obtaining more circuits on each semiconductor wafer or other substrate being processed.

Even though feature sizes used in integrated circuits and other microelectronic components have decreased dramatically, additional reductions are continuously being pursued. As feature size decreases, the importance of accurate temperature control during processing increases to even a greater degree. The temperature at which semiconductor wafers and other substrates are processed has a first order effect on the diffusion of dopants, deposition of materials or other thermal processes being performed. Thus it is important to have processing equipment which can achieve accurate temperature control to meet desired thermal processing specifications.

Temperature control feedback problems encountered in thermal processing of semiconductor devices can be thought of in several different ways. One control problem involves matching the workpiece temperature to the processing "recipe" set by the user. The "recipe" comprises the set-point temperatures, temperature process durations, temperature ramp rates, etc., that define the overall thermal process to which the wafer or other substrate is to be subjected. This recipe is generally programmed by the user and is dependent on the particular thermal processing requirements needed to produce the end product. Each portion of a recipe can conveniently be thought of in terms of three different phases. One phase is a ramp-up phase wherein the operating temperature increases or ramps from a lower level set-point temperature to a higher level set-point temperature. A further phase is a ramp-down phase wherein the operating temperature decreases from a higher level set-point temperature to a lower level set-point temperature. The temperature ramp-up or ramp-down phase is thereafter typically followed by a period during which a desired constant set-point processing temperature is maintained. Such a constant temperature phase includes a stabilization period during which the changing temperature ramp ends and a constant or near constant temperature is achieved. Constant temperature, ramp-up, and ramp-down phases may occur one or more times in a processing cycle. Ultimately, the temperature control problem involves both achieving the desired recipe temperatures and achieving relatively consistent temperatures from one production run to another.

Whether simple or more complex temperature recipes are used, each phase of the process may further be complicated by the introduction of one or more supplementary processing gases or vapor phase processing constituents which affect temperature and thermal response. Such supplementary processing gases are typically gases containing dopants, deposition materials or steam.

Various temperature control problems must be addressed by a thermal process control system if it is to meet the increasingly stringent requirements of the microelectronic circuit manufacturing industry. For example, each wafer in a batch should be subject to the same temperature conditions over the entire thermal processing cycle. Left uncontrolled, temperature variations occur between the wafers positioned near the ends of an array of wafers held within the processing furnace when compared to the wafers disposed at mid-portions of the furnace. There may also be other less predictable variations from wafer to wafer, such as along the array of wafers contained within the processing array.

A still further temperature control problem is associated with temperature variations that occur across the width of an individual wafer or other workpiece being processed. Heat from heating elements disposed about peripheral edges of the workpieces is radiated through the processing vessel. Variations can occur with regard to the heat gain experienced by the peripheral edges of the wafer as compared to the interior areas of the wafer. Variations in the degree of radiant heat transfer and radiant shadowing which occur from wafer to wafer further exacerbates this intra-wafer problem.

Minimization of the overall thermal processing time is also a concern that a thermal processing controller should address. Minimizing the processing time will typically increase the ramp-up phase temperature change rate. Conversely, time concerns will also increase the ramp-down phase temperature change rate. Increased rates of temperature change cause greater difficulties in maintaining recipe temperatures during the processes of transitioning between ramp-up and stabilization phases, and between stable temperatures and relatively rapid temperature ramp-down phases.

Traditionally, semiconductor thermal reactors have used Proportional-Integral-Derivative (PID) controllers to control temperature. Recently, a more accurate temperature control model based on H-∞ control the has been described and implemented in a furnace for use in microelectronic circuit manufacturing. Such control is disclosed and described in International Publication WO98/35531, titled "MODEL BASED TEMPERATURE CONTROLLER FOR SEMICONDUCTOR THERMAL PROCESSORS", which is hereby incorporated by reference.

The latter control system includes a preferred mode of operation in which a dynamic model formulated through empirical testing is used to control the thermal processing cycle based on a recipe that is, for example, entered by the user. The dynamic model is usually based on empirical testing that takes place over a predetermined temperature range. This predetermined temperature range is typically chosen to be centered about the temperatures at which the furnace is to operate most frequently. Other manners of selecting the predetermined temperature about which the dynamic model is formulated may also be employed.

The present inventors have found that the accuracy of a single controller design decreases as the actual furnace temperature or set-point temperatures of the recipe deviate beyond the predetermined temperature range. The use of a single controller design about a single predetermined temperature range may thus limit the use of the furnace to processing recipes in which the set-points are within this temperature range. As the thermal processing steps performed on semiconductor wafers and other substrates become more complex, a need arises for accurate thermal processing control across a wide dynamic range of processing temperatures.

Another temperature control problem involves the handling of hardware failures during execution of a processing recipe set by the user. Traditionally, temperature control systems used for temperature control of thermal reactors drive the reactor to the desired set-point temperature in accordance with a linear ramp function. A graph of the reactor temperature-vs.-time when the reactor temperature is driven in this manner is illustrated in FIG. 1. As shown, the temperature of the reactor overshoots the set-point temperature before the temperature controller it is ultimately able to regulate the reactor temperature at the set-point. Such overshoot may significantly alter the thermal processing of the semiconductor wafers, or other workpieces, in an undesirable manner. Overshoot becomes particularly problematic given the ever increasing demands placed on thermal reactor systems by the advanced processing techniques used in manufacturing sub-micron semiconductor devices.

Another temperature control problem involves the handling of hardware failures during execution of the processing recipe set by the user. During execution of the recipe, the temperature controller generally relies on one or more sensed temperature inputs to generate the requisite control output signals used to control the power supply to the heating elements and, ultimately, to control the temperature of the reactor. When one or more of the sensed temperature inputs is inaccurate due to, for example, a hardware failure of the temperature sensing element, the resulting control output signals are likewise inaccurate.

Temperature control systems used for temperature control of thermal reactors may shut down the reactor operations and, thus, discontinue execution of the recipe upon detection of a hardware failure of a temperature sensing element. This results in a complete shutdown of the reactor and interruption of the thermal processing of the workpieces. Given the strict thermal processing requirements for semiconductor integrated circuits, this interruption may result in the complete loss of the semiconductor wafers under process. Such losses may be very costly, particularly when the semiconductor wafers are in a late-stage of their processing. Similarly, such losses may be very costly when the semiconductor wafers are large (e.g., 300 mm).

A still further probblem is the problem of heating element failure detection and handling. The present inventors have recognized that heating element failures may occur due to various temporary conditions and that the heating element may again operate normally after the temporary condition ceases to exist or is otherwise rectified. In such instances, the heating element may be driven in an improper manner to the desired temperature and thereby damage the workpieces that are being processed or result in a further failure of the heating element (e.g., over-temperature condition).

The present inventors have recognized each of the foregoing problems and have set forth herein a temperature control system for a thermal reactor that addresses each such problem in a unique and efficient manner.

BRIEF SUMMARY OF THE INVENTION

A temperature control system for controlling the temperature of a thermal reactor is set forth. The temperature control system comprises a first temperature controller that applies a first dynamic model to a plurality of measured input parameters to generate a first set of control values. The first dynamic model is designed so that it is optimized over a first temperature range to provide generally optimal values for the first set of control values over the first temperature range. The temperature control system also includes a second temperature controller that applies a second dynamic model to a plurality of measured input parameters to generate a second set of control values. The second dynamic model is designed to be optimized over a second temperature range to provide generally optimal values for the second set of control values over the second temperature range. The first temperature range is different than the second temperature range. Control output selection switch logic is provided for determining which of the first or second set of control values is used to control the temperature of the thermal reactor. An observer gain feedback the system is used for driving the first set of control values toward the second set of control values when the second set of control values is used to control the temperature of the reactor. Similarly, the observer gain feedback system is used to drive the second set of control values toward the first set of control values when the first set of control values is used to control the temperature of the reactor. Such observer gain feedback facilitates optimal control of the temperature of the reactor when the control output selection switch logic switches control of the reactor temperature between the first and second temperature controllers. Further temperature controllers may also be added to cover further temperature ranges, and the observer gain feedback may be expanded accordingly.

In accordance with another aspect of the control system, the control system employs a virtual temperature sensor in the event of a hardware failure of the corresponding non-virtual temperature sensor. Upon the detection of a failure of the non-virtual temperature sensor the temperature control system automatically substitutes a virtual temperature sensor in its place he has a control system input. The virtual temperature sensor logic receives one or more measured input variables and applies these input variables to a dynamic model that correlates the measured input variables to a virtual temperature sensor output value that approximates the value of the non-virtual temperature sensor under the conditions indicated by the measured input variables. In this manner, execution of the processing recipe may continue and thereby limit the number of workpieces that are ultimately ruined as a result of the hardware failure.

In accordance with a still further aspect of the temperature control system, the control system is provided with enhanced ramp trajectory logic. Such logic assists in providing overshoot control and, further assists in stabilizing the overal operation of the reactor.

In accordance with a still further aspect of the temperature control system, the control system is provided with control logic that switches the control mode of the system in the event of a failure of a heating element. Again, this lessens the likelihood of loss of the entire batch of workpieces in the event of the failure of one or more heating elements.

BRIEF DESCRIPTION OF THE SEVERAL VIEWS OF THE DRAWINGS

FIG. 1 is a graph of reactor temperature-versus-time illustrating the temperature overshoot that commonly occurs using prior art temperature control systems.

DETAILED DESCRIPTION OF THE INVENTION

Figure 1A:
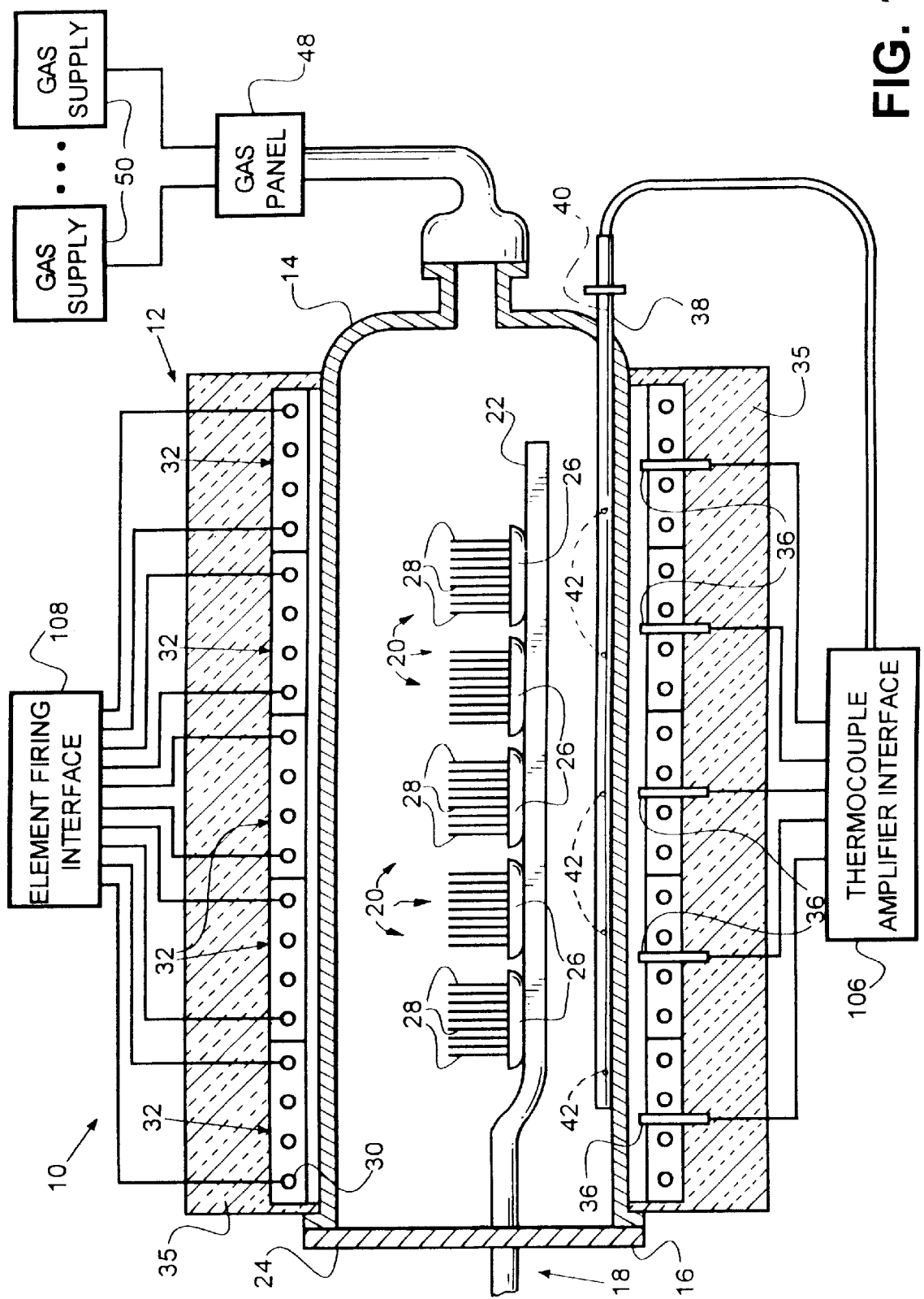
FIG. 1A is a side elevational view, partially in section, of a thermal reactor system that may be controlled using the temperature control system of the present invention.

A temperature control system for a thermal reactor is disclosed that addresses the problems noted above. In accordance with one aspect of the disclosed control system, a plurality of temperature controllers are employed. Each temperature controller employs one or more dynamic models that are optimized for a given temperature range. The temperature range over which a particular controller is optimized is preferably generally exclusive of the temperature ranges over which other controllers of the plurality of temperature controllers are optimized. As such, multiple controllers are available for control of the reactor temperature. Which of the multiple controllers is used to control the reactor temperature may be dependent on one or more input parameters to the temperature control system. Each of the controllers includes observer gain to the feedback logic that couples the multiple controllers to one another. The observer gain feedback logic causes the controller output to track the output of the controller that is then being used to control the reactor temperature.

In accordance with another aspect of the control system, the control system employs a virtual temperature sensor in the event of a hardware failure of the corresponding non-virtual temperature sensor. Upon the detection of a failure of the non-virtual temperature sensor, the temperature control system automatically substitutes a virtual temperature sensor in its place as a control system input. The virtual temperature sensor logic receives one or more measured input variables and applies these input variables to a dynamic model that correlates the measured input variables to a virtual temperature sensor output value that approximates the value of the non-virtual temperature sensor under the conditions indicated by the measured input variables. In this manner, execution of the processing recipe may continue and thereby limit the number of workpieces that are ultimately ruined as a result of the hardware failure.

In accordance with a still further aspect of the temperature control system, the control system is provided with virtual thermocouple logic. The virtual thermocouple logic, upon detection of the failure of one or more thermocouple devices, is effectively substituted for the failed component. This lessens the likelihood of loss of the entire batch of workpieces in the event of a failure of one or more temperature sensing circuits.

In accordance with a still further aspect of the temperature control system, the control system is provided with control logic that switches the control mode of the system in the event of a failure of a heating element. Again, this lessens the likelihood of loss of the entire batch of workpieces in the event of the failure of one or more heating elements.

All of the foregoing aspect of the present invention may be combined into a single temperature controller. Alternatively, these temperature control system improvements may be incorporated as individual elements, without reliance on the other inventive aspects disclosed herein.

EXEMPLARY TEMPERATURE CONTROLLER

FIG. 1A illustrates one embodiment of a thermal reactor system 10 that may be controlled using the temperature control system of the present invention. The thermal reactor system 10 includes a thermal reactor 12. Although the reactor of FIG. 1A is shown in a vertical orientation, the thermal reactor 12 can be oriented horizontally or vertically.

The thermal reactor 12 includes a process tube 14 defining a reactor chamber. The process tube 14 is preferably made of quartz, or silicon carbide. In the illustrated embodiment, the process tube is in the general shape of a hollow cylinder having an open end 16 and has a length which extends along and substantially defines a longitudinal axis. The thermal reactor system 10 further includes a boat loader or paddle 18 which inserts or removes a wafer load 20 into or from the process tube 14. More particularly, the boat loader 18 includes a support portion 22, and a door portion 24 which is movable with the support portion and which closes the open end of the process tube 14 when the support portion 22 is inserted into the process tube. The door portion 24 seals and insulates the process tube to prevent heat loss after the wafer load 20 has been inserted into the chamber of the process tube 14.

The wafer load 20 preferably includes a plurality of boats 26 that, for example, are formed of quartz or silicon carbide. The wafer load 20 further includes a plurality of silicon wafers 26, and each boat 24 supports a plurality of the wafers 26. In the illustrated embodiment, wafers on each boat 24 are equally spaced and the boats of wafers 26 generally form a wafer or other semiconductor workpiece processing array.

Figure 4:
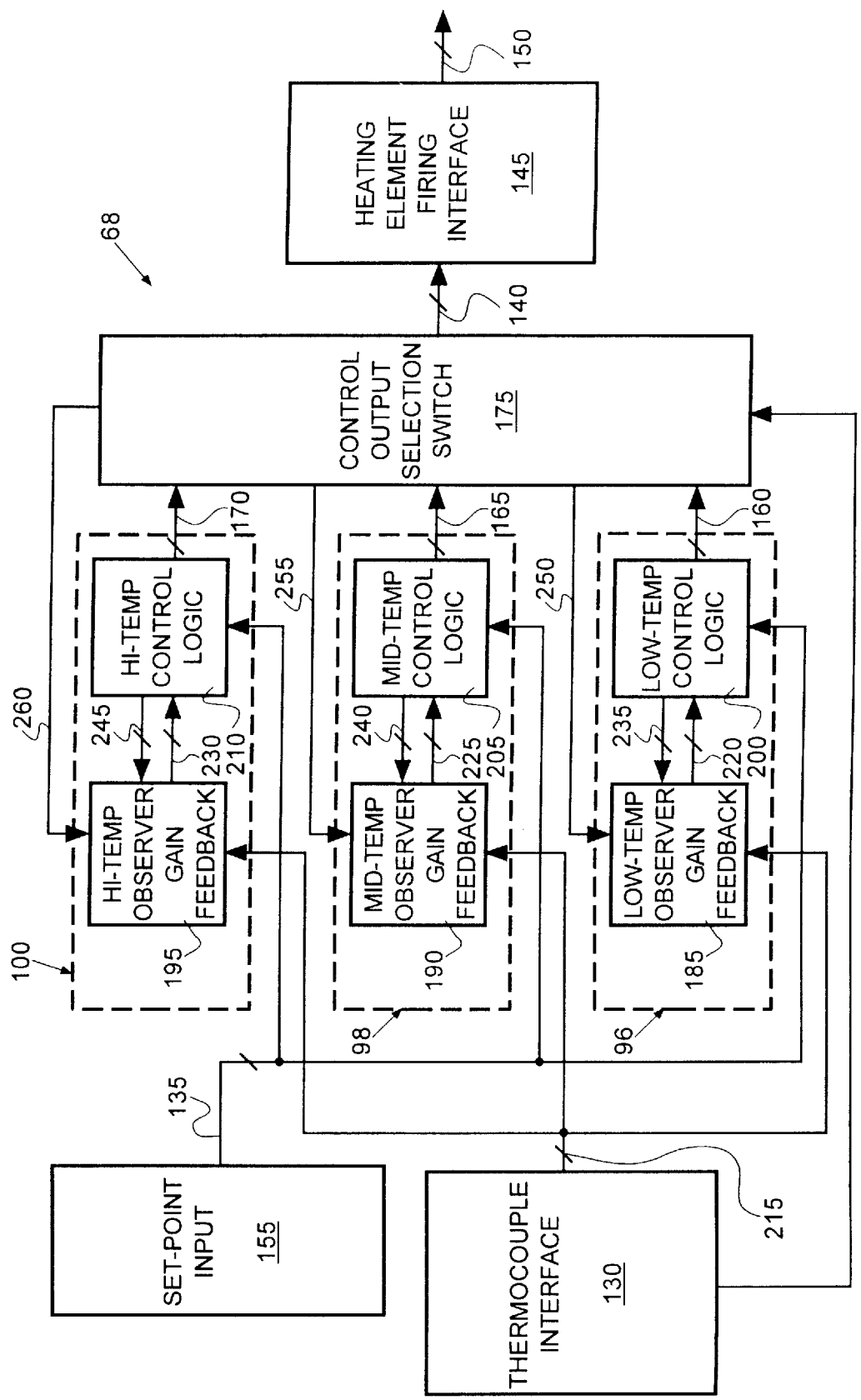
FIG. 4 is a logic flow diagram illustrating operation of a temperature control system constructed in accordance with one embodiment of the present invention.

The thermal reactor 12 also includes one or more heating elements 30 that surround the process tube 14. In the illustrated embodiment, the heating element 30 is an electrical resistance heating coil or coils extending along the length of the processing chamber parallel to the length of the process tube 14. The heating element 30 is preferably subdivided into a plurality of separately controllable heating zones 32 by, for example, providing connections along the coil to divide the coil or coils into separately controllable zones. The zones are then separately controllable by supplying power to opposite ends of each zone associated coil or portion of a larger coil. More particularly, as shown in FIG. 4, the thermal reactor system 10 includes high current voltage transformers 33 and silicon controlled rectifiers (SCRs) 34 for controllably applying power to each of the heating zones 32.

Ceramic insulation 35 encases the heating element 30. The insulation serves to reflect and otherwise direct heat toward the wafer array and, further, serves to provide a more uniform layer to minimize heat flux variations away from the processing array.

Temperature feedback and/or inputs for use in controlling the processing temperatures are derived from at least two sources: a plurality of spike thermocouples 36 and a plurality of profile thermocouples 42. Thermocouples as the term is used herein encompasses a variety of temperature sensors, including the more specific meaning of thermocouples. Alternative temperature sensor constructions are also intended by the use of the term thermocouples.

The spike thermocouples 36 are placed at a suitable location, such as between the heating element 30 and the process tube 14, to measure the temperature of the heating element at a respective zone. The spike thermocouples 36 are thus spaced apart along the length of the heating element 30, at least one spike thermocouple 36 being located in each of the heating zones 32. The spike thermocouples 36 provide the most specific and responsive indications of the temperature at or of the heating elements in each of the heating zones.

The profile thermocouples 42 are disposed along an elongated profile rod 40 and are supported in a sheath 38 that extends inside the process tube 14. The sheath 38 is preferably form of quartz or silicon carbide. The profile rod 40 has a length parallel to the length of the process tube 14. At least one thermocouple 42 is located in each of the heating zones 32. The profile thermocouples 42, however, are not necessarily aligned with the spike thermocouples 36. The profile thermocouples 42 measure temperature inside the process tube 14 and provide an indication of the temperature of the wafer load 20 in each of the respective heating zones.

Figure 1B:
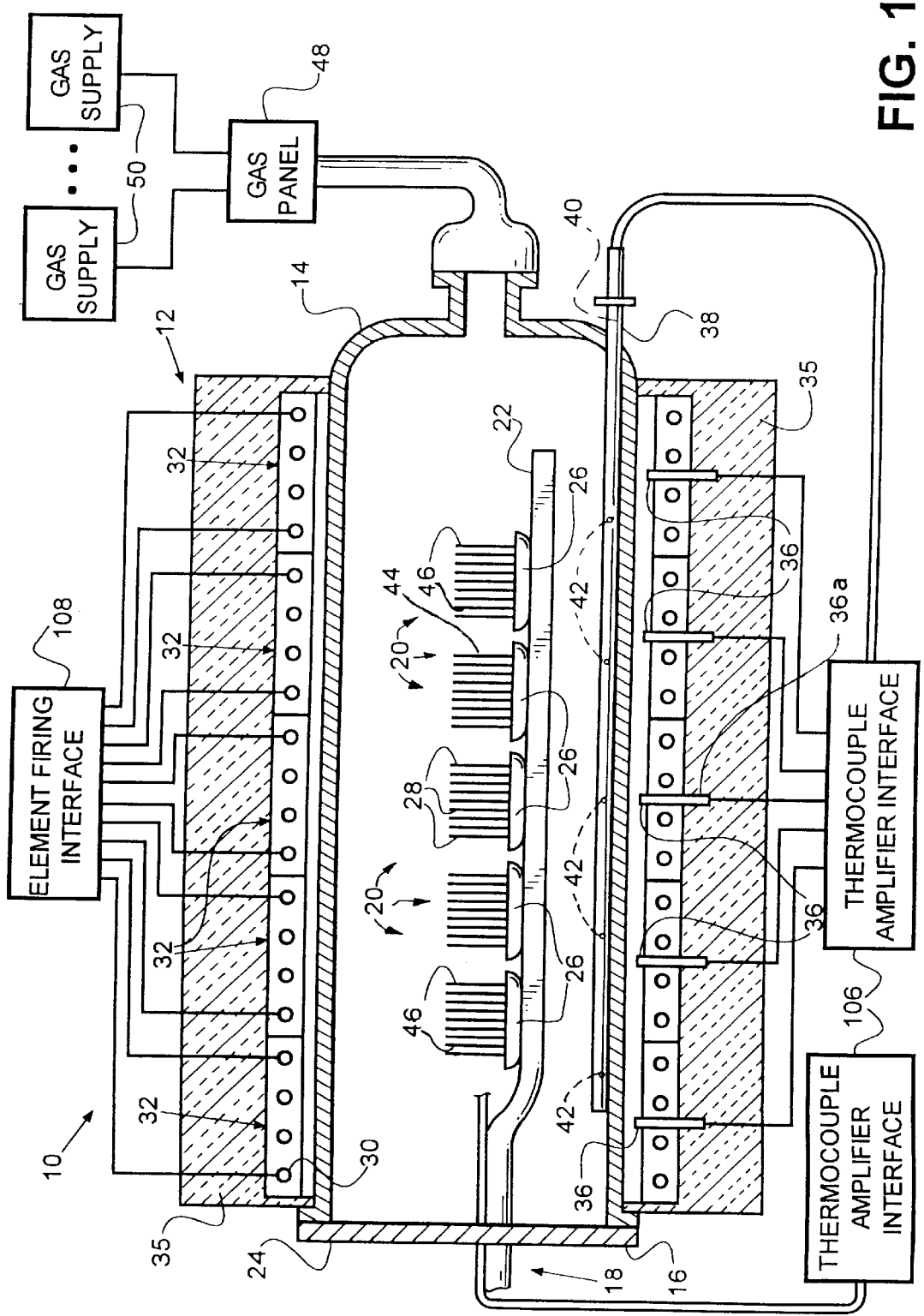
FIG. 1B is a side elevational view, partially in section, of the thermal reactor system of FIG. 1A during modeling and characterization using thermocouple instrumented wafers.

A plurality of thermocouple instrumented wafers 44 are optionally employed during modeling of the thermal reactor. FIG. 1B shows the thermal reactor 12 of FIG. 1A receiving the thermocouple instrumented wafers 44 during modeling. These thermocouple instrumented wafers 44 are uniformly spaced across the wafer load 16 to provide an accurate measurement of the actual temperature of the wafers 28. Each of the exemplary thermocouple instrumented wafers 44 includes a silicon wafer, and two thermocouples 46 bonded to the silicon wafer: one on the edge of the wafer, and one on the center of the wafer. The thermocouples 46 of each instrumented wafer 44 are bonded to the silicon wafer, such as with a ceramic adhesive, to provide accurate temperature measurements.

Figure 3:
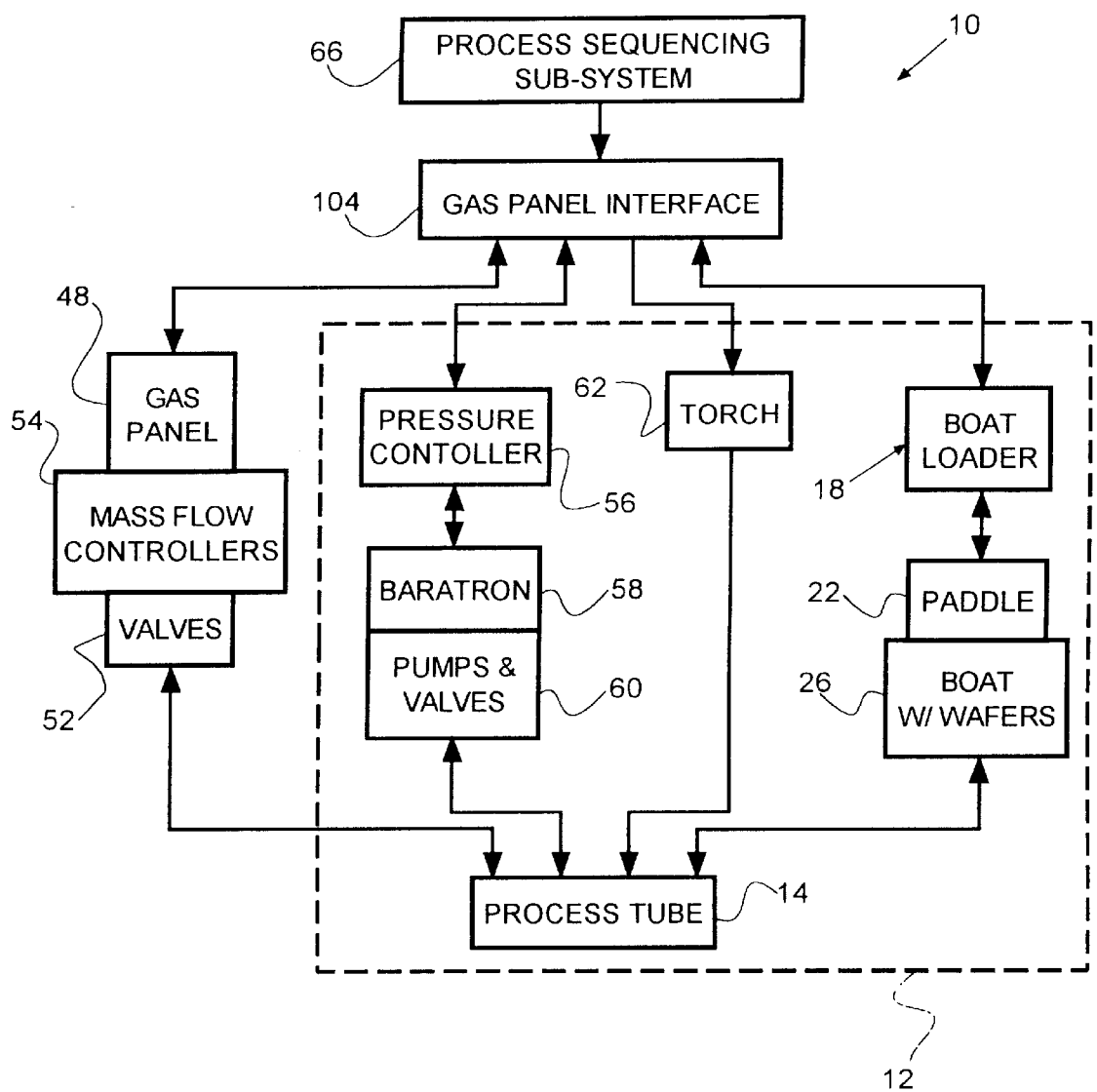
FIG. 3 is a schematic block diagram illustrating one embodiment of a process sequencing system and gas interface that may be used in conjunction with the control system of FIG. 2.

The basic structure of the thermal reactor system 10 may be enhanced to expand its applicability to a wide range of microelectronic circuit manufacturing processes. For example, the thermal reactor system 10 may include a gas delivery system or gas panel 48 for controllably injecting process gases from selectable gas supplies 50 into the process tube 14 to grow, diffuse, or deposit material on the surface of the silicon wafers 28. The gas panel 48, as shown in FIG. 3, includes valves 52 and mass flow controllers 54. The mass flow controllers 52 are used to measure and control flows of process gasses into the process tube 14. The thermal reactor 12 may further include a torch 62 internal or external to the process tube 14. The torch 62 is used for wet oxidation processes by burning a ratio of hydrogen and oxygen to produce steam in the process tube 14.

In accordance with another enhancement, the process tube 14 may be pressurized for low pressure chemical vapor deposition (LPCVD) processes. As shown in FIG. 3, such a thermal reactor system 10 preferably includes a pressure controller 56 and a baratron or other suitable pressure sensing device 58 which measures the pressure in the process tube and communicates the measured pressure to the pressure controller 56. Further, in these embodiments, the thermal reactor system 10 may include pumps and valves 60, in communication with the pressure controller 56, that are used to achieve the desired pressure in the process tube 14 for the LPCVD process.

Figure 2:
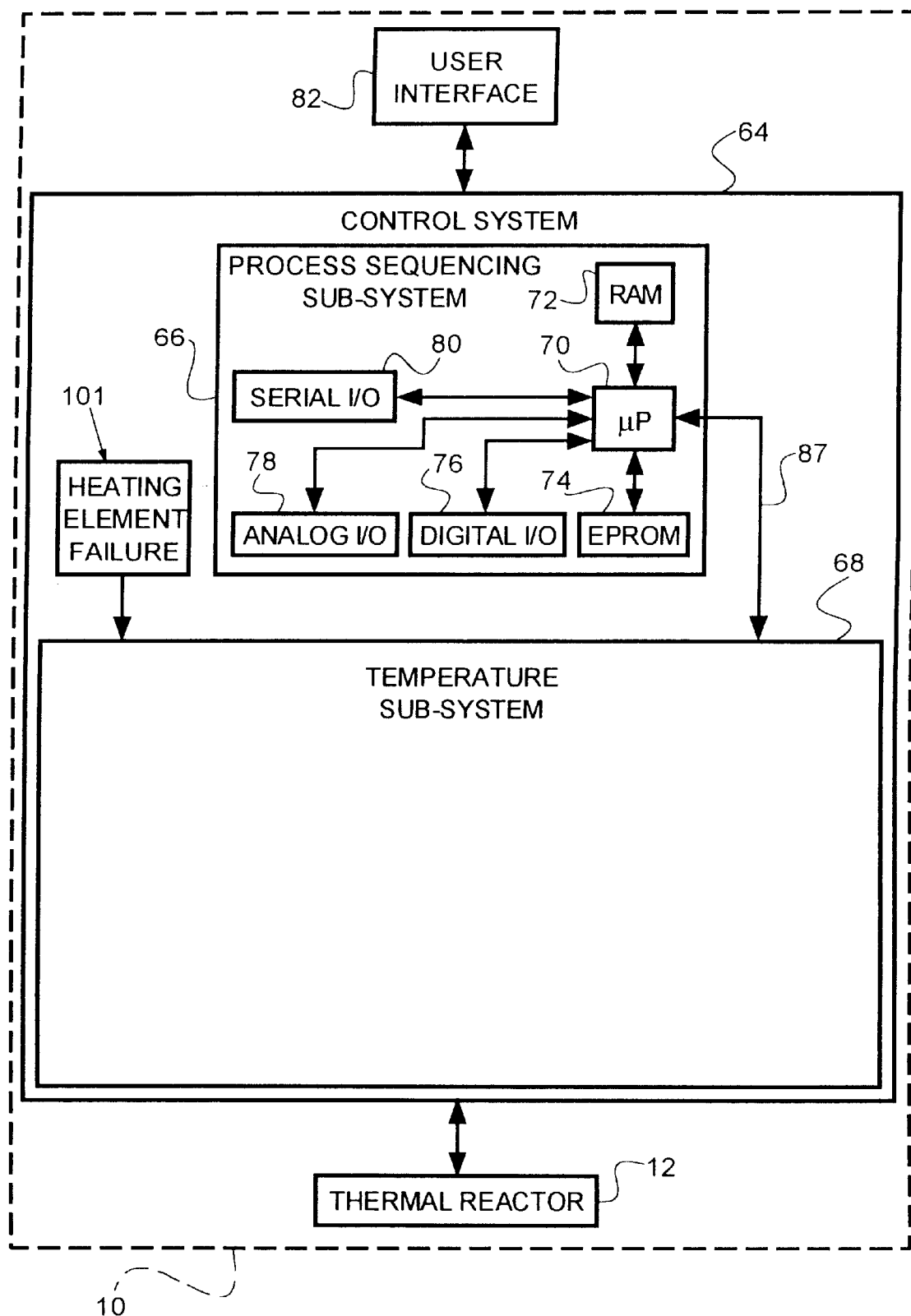
FIG. 2 is a block diagram illustrating a preferred architecture for an overall control system that includes the temperature control system of the present invention.

Control of the operation of the hardware described above is preferably achieved by interfacing the hardware with a programmable control system that is suitable for entering and executing a user programmed recipe. With reference to FIG. 2, the thermal reactor system 10 includes a control system 64 for controlling the temperature and other processes in the thermal reactor 12. The control system 64 is preferably divided into two subsystems: a process sequencing subsystem 66 for accepting and executing a process sequence, and a temperature subsystem 68 for temperature control in accordance with the process sequence. Both the process sequencing subsystem 66 and temperature control subsystem 68 follow user defined process recipes that, for example, are entered through user interface 82.

In the illustrated embodiment, the process sequencing subsystem includes a microprocessor that interfaces with random access memory 72, a programmable EPROM 74 that stores controller logic, a plurality of digital input and output channels 76, a plurality of analog input and output channels 78, and a user interface 82. A plurality of serial input and output channels 80 for external (remote) communication may be included, if external communication is desired. While other user interfaces can be employed, the user interface 82 of the disclosed embodiment comprises a touch screen terminal interface with which a user can enter a user defined process recipe. In the process recipe, the user can define, on a per step basis, step time, gas flows, chamber pressure, temperature setpoints, and ramp rates. Parameters necessary for temperature control are communicated to the temperature control subsystem 68 as input parameters that are used by the temperature control subsystem to implement the temperature control aspects of the recipe. This communication capability is illustrated by line 87. In the disclosed embodiment, such parameters comprise at least the temperature setpoints entered by the user for the recipe.

As noted above, the thermal reactor system 10 may include enhancements, such as a gas delivery system and/or pressure control system, that may be used for film deposition or the light. Such a system may include the control system interface illustrated in FIG. 3 that provides an interface between the process sequencing subsystem 66 and the hardware of the gas delivery system and/or pressure control system. As shown in FIG. 3, a gas panel interface 104 is connected between the gas panel 48 and the process sequencing subsystem 68. The gas panel interface 104 provides the control system 64 with an interface to communicate with the mass flow controllers 54, the gas valves 52, the internal or external torch 62, the pressure controller 56, the boat loader 18, etc. Further, the gas panel interface 104 may include a a plurality of hardware safety interlocks for the thermal reactor (e.g., to ensure hydrogen flow with a proper oxygen to hydrogen ratio, to detect a flame from the torch 62, etc.).

The temperature control system 68 controls the temperature within the thermal reactor 12 in accordance with a user programmed recipe. Temperature control is preferably based on dynamic modeling of the thermal reactor 12 in which desired temperature states are modeled based on measurable system parameters. In operation, the recipe comprises temperature set-point values that are used by one or more dynamic models to drive the thermal reactor 12 to the desired temperature state.

THERMAL REACTOR HAVING MULTIPLE TEMPERATURE CONTROLLERS

With reference again to FIG. 4, the temperature control subsystem 68 receives at least two input signals for each predefined heating zone: a profile thermocouple input from which the temperature at the profile thermocouple for the respective heating zone may be determined, and a spike thermocouple input from which the temperature at the spike thermocouple for the respective heating zone may be determined. These profile and spike temperatures are provided through a thermocouple interface 130 as illustrated by line 215 and are used in conjunction with the temperature set-point input at line 135 to provide one or more heating element output control values at lines 140. The output control values at lines 140 are supplied to the input of a heating elements control interface 145 and are used to control the electrical power that is supplied at lines 150 to respective heating zone elements.

FIG. 4 illustrates one manner of implementing the temperature control subsystem 68. As shown, a plurality of multivariable controllers 96, 98, and 100 are employed. Each of the controllers 96, 98, and 100, is designed, preferably based on one or more dynamic models derived from emperical test data, for optimum control accuracy over a predetermined temperature range that is generally exclusive of the temperature range of the other controllers. To this end, controller 96 is designed for optimal temperature control over a low-level temperature range, controller 98 is designed for optimal temperature control over a mid-level temperature range, and controller 100 is designed for optimal temperature control over a high-level temperature range. Although the temperature ranges for which the controllers are designed are generally unique, it will be recognized that some overlap of the temperature ranges may be desired. In accordance with one embodiment of the system, the low level temperature range may be centered about 500 degrees Celsius, the mid-level temperature range may be centered about 800 degrees Celsius, and the high-level temperature range may be centered about 1050 degrees Celsius. The range over which each controller operates thus extends roughly ±150 degrees about the center range temperature.

Each of the controllers 96, 98, and 100 is constructed using robust optimal control theory with empirically derived models of the furnace and workpieces that are to be heated. More particularly, in the illustrated embodiment, the multivariable controllers 96, 98, and 100 are preferably constructed using H-Infinity control theory. One manner of deriving the models used in the controllers 96, 98, and 100 is set forth in WO98/35531 cited above. As disclosed in that application, each controller design preferably employs two dynamic models. One of the dynamic models relates power inputs to spike outputs and the second model relates spike inputs to profile outputs. However, it will be recognized that other multi-variable control logic designs may also be used.

The control logic flow illustrated in FIG. 4 is generally independent of the particular control theory used to design the controllers 96, 98, and 100. The only general requirement is that each controller 96, 98, and 100 is capable of generating an accurate control output based on one or more measured variable inputs.

In the illustrated system, the variable inputs to each controller comprise the set-point input and one or more of the temperature data inputs indicative of the temperature detected by the thermocouples 36 and 42. The set-point input, shown generally in logic block form at 155, holds the set-point temperature value that is to be attained. This value is determined by the particular recipe that is being implemented by the system 10, and is concurrently supplied to the input of each of the controllers 96, 98, and 100. Similarly, each of the controllers 96, 98, and 100 concurrently receives a plurality of data values indicative of the temperature values sensed by the thermocouples 36 and 42. The set-point temperature value and the thermocouple data values are applied to a dynamic model respectively associated with each of the controllers 96, 98, and 100, to generate respective output control values, generally illustrated at lines 160, 165, and 170.

As noted above, the dynamic model used by each controller is optimized for use over a temperature range that is generally exclusive of the temperature range for which the dynamic models of the other controllers are designed. As such, the output control values at lines 160, 165, and 170 provide three potential solutions that may be used to drive the reactor 12 to the desired set-point temperature. Only one of the three potential solutions, however, may be optimal for a given reactor condition because the models used by the controllers differ from one another and are optimized only over a predetermined temperature range. The temperature subsystem 68 must therefore select which set of control values is to be provided to the heating element firing interface 145 to control the heating elements and, thus, the reactor temperature.

In the illustrated system, the selection of which set of control values is provided to the interface 145 is executed by control output selection switch logic, shown generally in logic block form at 175. As shown, the control values at lines 160, 165, and 170 are provided to the input of the control output selection switch 175 which, in turn, switches one set of control values to a control value output, shown generally by line 140, based on predetermined selection criteria. The selection criteria are preferably based on measurable input values that indicate which of the dynamic models used in deriving the controllers 96, 98, and 100, is optimal under the given conditions.

One of the criterion that may be used by the control output selection switch 175 as a basis for selecting which of the control values is to be provided to the heating element firing interface 145 is the set-point input value at 135. As shown by line 135, the set-point input value may be provided as an input to the control output selection switch 175. Which set of control values illustrated at lines 160, 165, and 170 is provided at the output of the control output selection switch 175 thus depends on the particular temperature set-point input value provided at line 135.

In accordance with one mode of operation, switching logic dependent on the value of the temperature set-point input value may involve allocating upper and/or lower set-point temperature threshold values to each of the controllers 96, 98, and 100. For example, the output value 160 of the low-level temperature controller 96 may be switched to the output 140 whenever the set-point temperature value is below a given threshold value, $T_{Low}$. When the set-point temperature value is above $T_{Low}$, but below a further threshold value, $T_{High}$, the set of control values at 165 of the mid-level temperature controller 98 may be switched to the output 140. Similarly, when the set-point temperature value is above $T_{High}$, the set of control values at 170 of the high-level temperature controller 100 may be switched to the output 140. In this example, the value of $T_{Low}$ is preferably chosen to be close to the upper temperature value for which the dynamic model used by the low-level temperature controller 96 is accurate and/or optimal. Alternatively (or in addition), $T_{Low}$ may be chosen to be close to the lower temperature value for which the dynamic model used by the mid-level temperature controller 98 is accurate and/or optimal. The value of $T_{High}$ is preferably chosen to be close to the upper temperature value for which the dynamic model used by the mid-level temperature controller 98 is accurate and/or optimal. Alternatively (or in addition), $T_{High}$ may be chosen to be close to the lower temperature value for which the dynamic model used by the high-level temperature controller 100 is accurate and/or optimal.

Another criterion that may be used by the control output selection switch 175 as a basis for selecting which set of control values is to be provided to the heating element firing interface 145 is a thermocouple temperature input value as detected by one or more of the thermocouples 36 and 42. As shown by line 180, the thermocouple temperature input value may be provided as an input to the control output selection switch 175. Which set of control values illustrated at lines 160, 165, and 170 is provided at the output of the control output selection switch 175 thus depends on the particular thermocouple temperature input value provided at line 180. Preferably, a thermocouple, such as a spike thermocouple 36a of FIG. 2, disposed proximate a mid-portion of the reactor chamber is used to provide the thermocouple temperature input value. Thermocouples disposed proximate the mid-portion of the reactor chamber tend to provide temperature input values that are more indicative of the average temperature across the entire chamber.

In operation, switching logic dependent on the value of the thermocouple temperature input value may involve allocating temperature ranges over which each of the controllers 96, 98, and 100 is to be selected for output. If the thermocouple input value indicates a temperature lying in a range below a given threshold value, $T_{Low}$, the set of control values available at 160 of the low-level temperature controller 96 may be switched to the output 140. Whenever the thermocouple input value indicates a temperature lying in a range above $T_{Low}$ but below a further threshold value, $T_{High}$, the set of control values illustrated at line 165 of the mid-level temperature controller 98 may be switched to the output 140. Similarly, when the thermocouple input value indicates a temperature that is in a range above $T_{High}$, the set of control values illustrated at line 170 of the high-level temperature controller 100 may be switched to the output 140. In this example, the value of $T_{Low}$ is again preferably chosen to be close to the upper temperature value for which the dynamic model used by the low-level temperature controller 96 is accurate and/or optimal, but may alternatively (or in addition) be chosen to be close to the lower temperature value for which the dynamic model used by the mid-level temperature controller 98 is accurate and/or optimal. Similarly, the value of $T_{High}$ is preferably chosen to be close to the upper temperature value for which the dynamic model used by the mid-level temperature controller 98 is accurate and/or optimal, but may alternatively (or in addition) be chosen to be close to the lower temperature value for which the dynamic model used by the high-level temperature controller 100 is accurate and/or optimal.

The present inventors have found that it is desirable to have all of the controllers 96, 98, and 100, calculating control values based on their respective dynamic model even when the control value of a particular controller is not used at output line 140. However, they have also recognized that switching to a control value output of a previously unused controller once the switching criterion for the unused controller have been met in the control output selection switch logic 175 may result in the control system 68 driving the reactor 12 to the desired set-point temperature value in a sub-optimal manner. This is due to the fact that the dynamic model used in the unused controller differs from the dynamic model of the controller that is used prior to the control value switch. The different dynamic models result in substantially different control value solutions available for output at line 140.

To reduce sub-optimal driving of the reactor 12 when switching between sets of control values, each controller 96, 98, and 100, is logically divided into a respective observer gain feedback logic unit 185, 190, and 195, and a respective temperature control logic unit 200, 205, and 210. Each temperature control logic unit 200, 205, and 210, implements the respective dynamic model based on the set-point input value 155, the plurality of thermocouple data values indicated by line 215, and an observer gain feedback output value provided from the respective observer gain feedback logic unit as shown at lines 220, 225, and 230. Each observer gain feedback logic unit 185, 190, and 195, receives one or more input values that are used to generate the observer gain feedback output value to the respective temperature control logic unit 185, 190, and 195. In the illustrated embodiment, each observer gain feedback logic unit 185, 190, and 195, receives one or more controller output values calculated by the respective temperature control logic unit 200, 205, and 210, as shown at lines 235, 240, and 245, and feedback values provided from the control output selection switch logic 175 as shown at lines 250, 255, and 260. The controller output values shown by lines 235, 240, and 245, are preferably data values calculated within the respective temperature control logic unit that are used in observer feedback paths within the temperature control logic unit to ultimately calculate the control values at the controller output. The observer feedback values provided from the control output selection switch logic 175 indicate contain the control output of the particular controller that has been selected for output at line 140.

In operation, the observer gain feedback value at lines 220, 225, and 230 for a particular controller differs for a given set of controller output values at lines 235, 240, and 245, depending on whether or not the control value output of the particular controller is being supplied at output line 140 for provision to the heating element firing interface 145. For example, a given set of low temperature controller output values at line 235 results in a set of control values, X at line 160 when the value input at line 250 indicates that the output of the controller 96 at line 160 is provided at output 140. This same given set of low temperature controller output values at line 235 results in a different set of control values, Y, at line 160 when the value input at line 250 indicates that the output of the controller 96 at line 160 is not provided at output 140. To this end, the controller output model at lines 235, 240, and 245 minus analogous observer feedback values at lines 250, 255 and 260 are preferably subject to a first control matrix calculation by the respective observer gain feedback logic unit 185, 190, and 195, when the control value output of the particular controller is supplied at output line 140, and are preferably subject to a second control matrix calculation by the respective observer gain feedback logic unit when the control value output of the particular controller is not supplied at output line 140. These values are then provided to the respective temperature control logic unit at the output line 220, 225, or 230, of the respective observer gain feedback logic unit 185, 190, and 195. Gain control matrix constants of the first gain control matrix calculation are preferably selected so that the particular controller operates in an optimal fashion within the temperature range for which its dynamic model is designed. A different gain matrix constant is used for the second gain matrix calculation. This second gain matrix is preferably selected so that the control value output of the particular controller generally tracks the control value output of the controller selected by the control output selection switch 175. As such, each controller provides an optimal control value at its output when the control output selection switch provides its control value at output line 140, and provides a control value that generally tracks the control value output of one or more of the other controllers when the control value of one of the other controllers is provided at output line 140. The constants for the first and second gain matrix calculation for a given temperature controller 96, 98, and 100 may differ (and, generally, do differ) from the corresponding constants used in the other temperature controllers.

Figure 5:
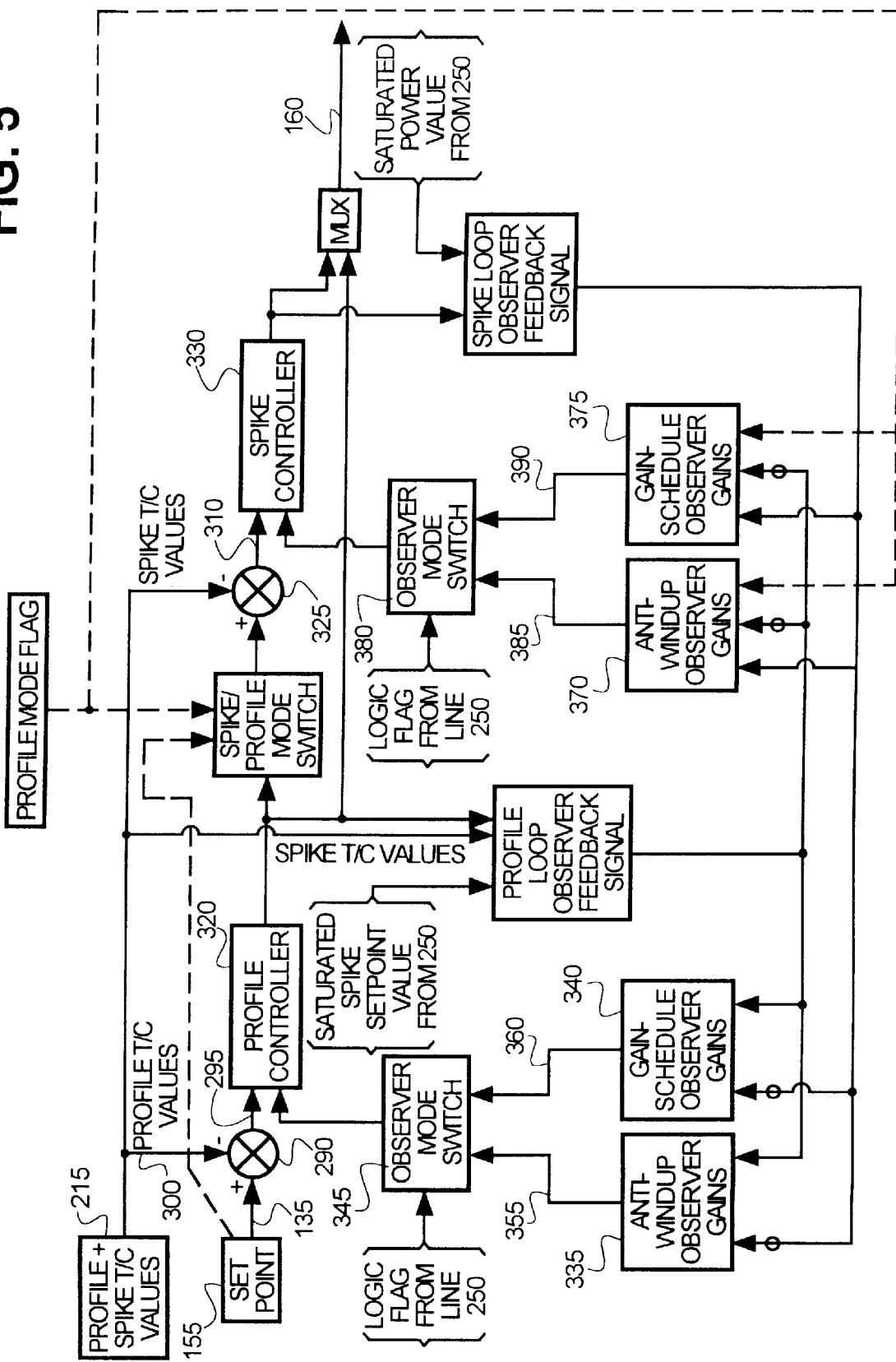
FIG. 5 is a logic flow diagram illustrating operation of a controller employing H∞ control logic wherein the controller may be used to construct the system of FIG. 4.

As noted above, the embodiment illustrated in FIG. 4 is generally independent of the particular multi-variable controller used by the temperature controllers 96, 98, and 100. FIG. 5, however, illustrates one manner of implementing a temperature controller using two dynamic models: one model relating power inputs to spike outputs, and the other model relating spike inputs to profile outputs. The dynamic models are specifically designed for using the temperature values provided by the profile and spike thermocouples. The controller logic architecture is suitable for use in the temperature control subsystem set forth in FIG. 4. The architecture of FIG. 5, although designated with the label 96 of the low-level temperature controller, is suitable for use in the design of each of the temperature controllers 96, 98, and 100.

As illustrated, the controller, shown generally at 96, includes a profile error signal generator 290 that generates profile error values at line 295 based on a comparison between the temperature set-point value as designated at line 135 and profile thermocouple values received at line 300. Similarly, a spike error signal generator 305 generates spike error values at line 310. The profile error values at line 295 are provided to the input 315 of the profile controller 320 while the spike error values at line 310 are provided to the input 325 of the spike controller 330. Such a design is set forth in WO 98/35531 and the specific details thereof are omitted for the sake of simplicity.

Unlike the basic temperature controller of the parent application, the controller 96 implements observer gain feedback logic in accordance with the system architecture of FIG. 4 and the corresponding disclosure above. To this end, an anti-windup gain computation matrix 335, a gain-schedule computation matrix 340, and an observer mode switch 345 are used to compute the values of the parameters provided at input 315. The anti-windup gain computation matrix 335 provides output values at 355 that are computed using a first set of gain parameters. The gain-schedule computation matrix 340 provides output values at 360 that are computed using a second set of gain parameters. The output values at 355 and 360 are provided to the input of the observer mode switch 345. The observer mode switch 345 selects which of the values at 355 or 360 are provided to the input 315 of the profile controller 320. The observer mode switch 345 provides the output values at 355 of the anti-windup gain computation matrix 335 when the value of the signal illustrated at 250 indicates that the control values at output 160 of the controller 96 are being provided to the heating element firing interface 145. Similarly, the observer mode switch 345 provides the output values at 360 of the observer gain computation matrix 335 when the value of the signal illustrated at 250 indicates that the control values at output 160 of the controller 96 are not being provided to the heating element firing interface 145.

A similar logic architecture is associated with the spike controller 330. As illustrated, an anti-windup gain computation matrix 370, a gain-schedule computation matrix 375, and an observer mode switch 380 are used to compute the values of the parameters provided at input 325. The anti-windup gain computation matrix 370 provides output values at 385 that are computed using a first set of gain parameters. The gain-schedule computation matrix 375 provides output values at 390 that are computed using a second set of gain parameters. The output values at 385 and 390 are provided to the input of the observer mode switch 380. The observer mode switch 380 selects which of the values at 385 or 390 are provided to the input 325 of the spike controller 330. The observer mode switch 380 provides the output values at 385 of the anti-windup gain computation matrix 370 when the value of the signal illustrated at 250 indicates that the control values at output 160 of the controller 96 are being provided to the heating element firing interface 145. Similarly, the observer mode switch 380 provides the output values at 390 of the observer gain computation matrix 375 when the value of the signal illustrated at 250 indicates that the control values at output 160 of the controller 96 are not being provided to the heating element firing interface 145.

A de-coupled observer feedback system can also be implemented using the logic architecture of FIG. 5. In such a system, the gains associated with the input values designated with circles are set to zero.

It should be noted that a wide range of system logic architectures are suitable for implementing a temperature control system that utilizes both the profile and spike thermocouple data values to calculate control values that are selectively provided to the heating element firing interface 145 and which include the disclosed observer gain feedback logic. For example, rather than using a controller in which the spike and profile controllers are designed for the same temperature range, the temperature control system may be designed so that a set of output values from one of a plurality of profile controllers designed for different temperature ranges are selectively supplied to the input of a single, common spike controller. In such a system, the disclosed observer mode feedback logic would be applied solely to each profile controller.

TEMPERATURE CONTROL SYSTEM HAVING ENHANCED RAMP TRAJECTORY LOGIC

Figure 6:
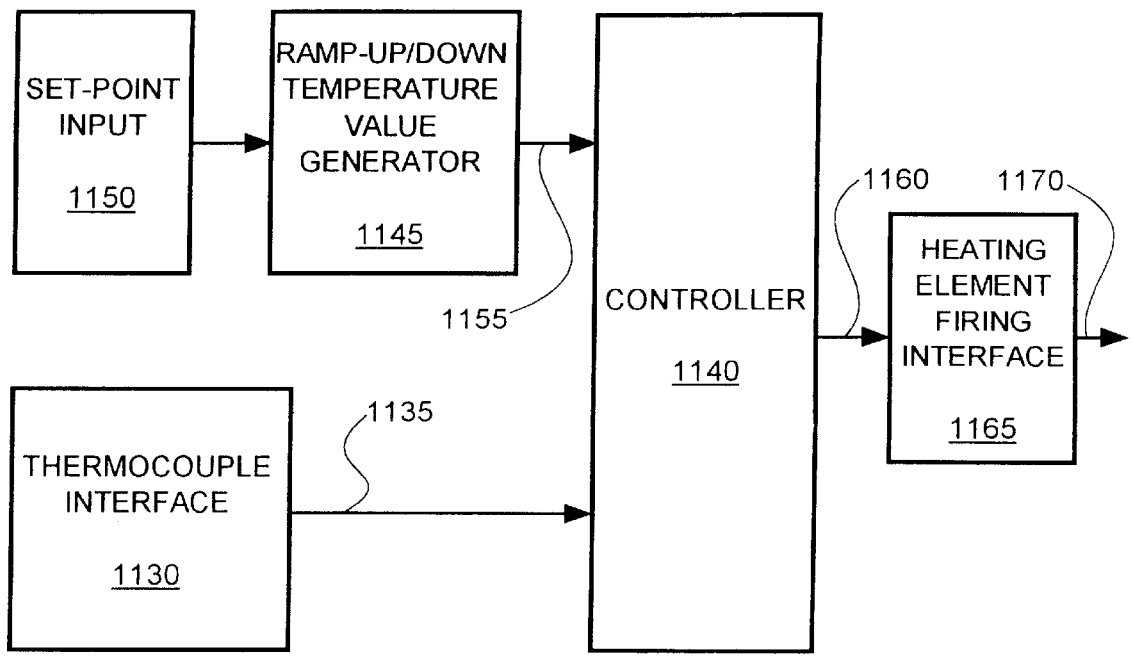
FIG. 6 is a logic flow diagram illustrating operation of one embodiment of a temperature control system having temperature overshoot.

FIG. 6 illustrates one manner of implementing the temperature control system 68 with enhanced ramp trajectory logic. As shown, a controller 1140 is connected to receive a plurality of data values represented by line 1135 that correspond to the temperature values as measured by the thermocouples 36, 42. Additionally, the controller 1140 receives temperature output values, $T_{output}$, from a ramp-up/ramp-down temperature value generator 1145. As will be explained in further detail below, the temperature value generator 1145 provides the temperature output values, $T_{output}$, to the controller 1140 in response to at least the temperature set-point input value, shown logically at 1150, that, for example, is entered by the user as part of the process recipe. It is the logical operations performed by the ramp-up/ramp-down temperature value generator to generate the temperature output values, $T_{output}$, that assist in preventing temperature overshoot in the thermal reactor 12.

The controller 1140 is constructed using robust optimal control theory with empirically derived models of the furnace and workpieces that are to be heated. More particularly, in the illustrated embodiment, the controller 1140 is a multi-variable controller that uses a dynamic model constructed using H-infinity control theory. One manner of deriving the dynamic model used in the controller 1140 is set forth in WO98/35531, titled "MODEL BASED TEMPERATURE CONTROLLER FOR SEMICONDUCTOR THERMAL PROCESSORS", which is hereby incorporated by reference. However, it will be recognized that other multi-variable control logic designs may alternatively be used. The control logic flow illustrated in FIG. 6 is thus generally independent of the particular control theory used to design the controller. The only general requirement is that the controller 1140 is capable of executing a dynamic model based on one or more measured variable inputs.

The controller 1140 applies the temperature output value provided at 1155 and the thermocouple data values at 1135 to its dynamic model. The controller 1140 uses the input values to generate an output that comprises a plurality of control values that are provided, for example, at the output represented by line 1160 to the input of a heating element firing interface 1165. The firing interface 1165 applies controlled power to the heating element zones at lines 1170 based on the values of the control values to thereby adjust the amount of heat provided in each zone and thus regulating the reactor temperature.

Notably, the controller 1140 does not receive the set-point input value for direct input to its dynamic model. Rather, the temperature set-point input value is provided to the temperature value generator 1145 which, in turn, provides the controller 1140 with incremental temperature output values, $T_{output}$, that the controller 1140 uses for temperature control of the thermal reactor 12. The temperature output values, $T_{output}$, form a modified ramp function over time. The temperature output values forming the modified ramp function drive the controller 1140 at or close to a maximum ramp rate toward the temperature set-point input value, $T_{sp}$, during a portion of the ramp-up phase. The ramp rate of the modified ramp function, however, may be reduced as it approaches the temperature set-point value in order to improve temperature control, avoid wafer slip, etc.

Figure 7:
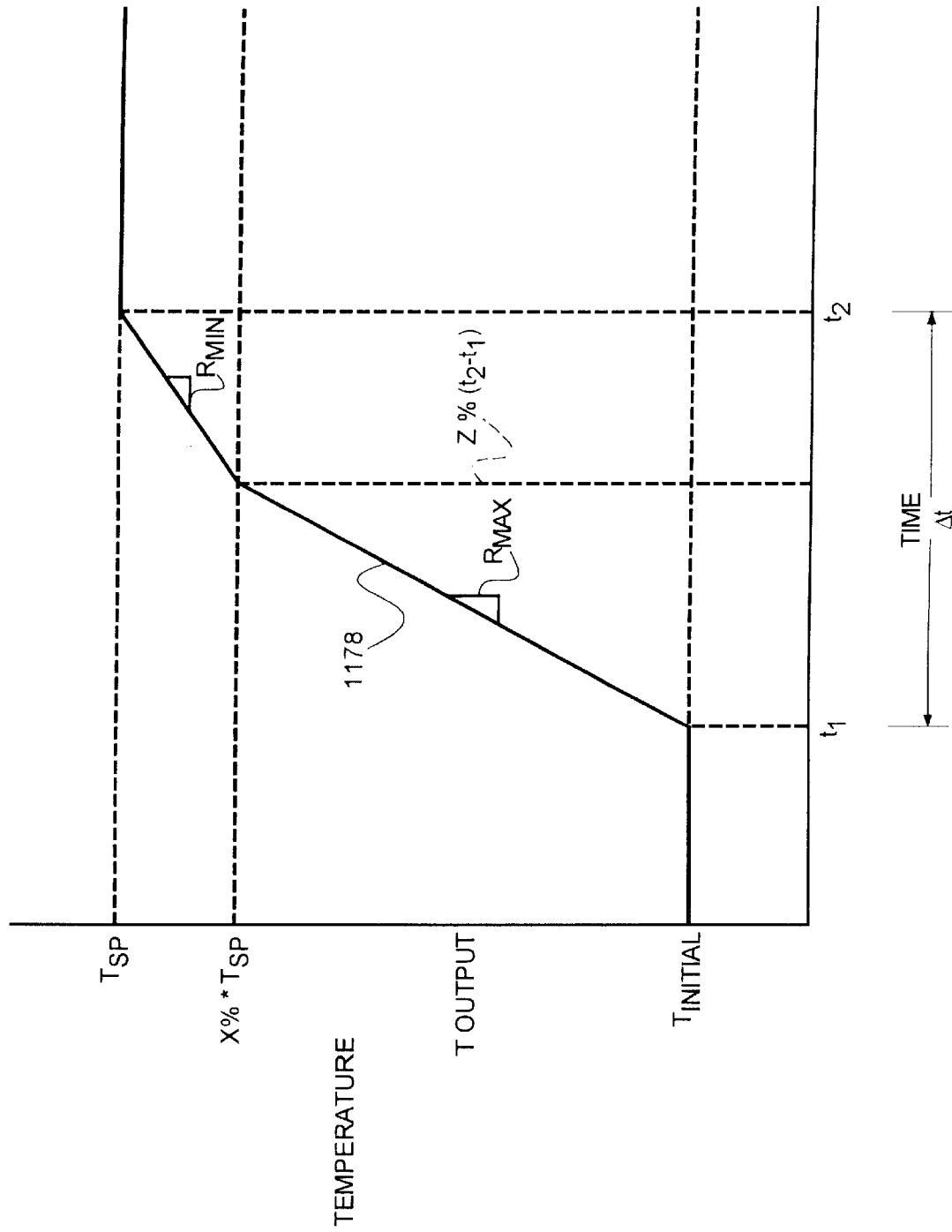
FIG. 7 is a graph illustrating one embodiment of a modified ramp function that may be applied to the input of the controller of the temperature control system to limit temperature overshoot during a ramp-up temperature phase.

There are several novel manners for implementing the modified ramp function of the temperature value generator 1145. FIG. 7 illustrates one such implementation.

With reference to FIG. 7, the goal of the temperature value generator 1145 is to provide a sequence of temperature output values, $T_{output}$, that drive the controller 1140 and, thus, the reactor temperature, from an initial temperature, $T_{initial}$, to the temperature set-point input value, $T_{sp}$. In doing this, the temperature value generator 1145 provides temperature output values, $T_{output}$, that form a modified ramp function over time. One particular form of such a modified ramp function is designated by line 1178.

As illustrated by line 1178, the temperature value generator 1145 receives a new temperature set-point input value at time $t_1$ and proceeds to provide the controller 1140 with incremental temperature output values, $T_{output}$, that correspond to a maximum ramp rate, $R_{max}$. The value of the maximum ramp rate, $R_{max}$, may be based on a value input by the user or may be a predetermined system constant.

As the value of the temperature output value, $T_{output}$, approaches the temperature set-point input value, $T_{sp}$, the temperature value generator 1145 begins to provide the controller 1140 with temperature output values, $T_{output}$, that correspond to a minimum ramp rate, $R_{min}$. This minimum ramp rate is used until the temperature output value, $T_{output}$, provided by the temperature value generator 1145 equals the temperature set-point input value, $T_{sp}$. The value of the minimum ramp rate, $R_{min}$, may be based on a value input by the user or may be a predetermined system constant. It is preferably set to the minimum ramp rate that generates the maximum tolerable temperature overshoot in the thermal reactor 12 that does not impair the thermal processing of the workpieces beyond process tolerances.

The point at which the temperature value generator 1145 switches from the maximum ramp rate, $R_{max}$, to the minimum ramp rate, $R_{min}$, may be set in a number of ways. For example, the temperature value generator 1145 may switch to the minimum ramp rate when the temperature value is equal to or exceeds a threshold value. This threshold value may be based on the percentage, X of the temperature set-point input value, $T_{sp}$. The value of X may be part of the recipe entered by the user, or it may be a predetermined system constant. Similarly, the temperature value generator 1145 may switch to the minimum ramp rate at a predetermined time in the ramp-up phase. This predetermined time value may be based on the predetermined percentage, Z, of the total ramp time, $(t_2-t_1)$.

Figure 8:
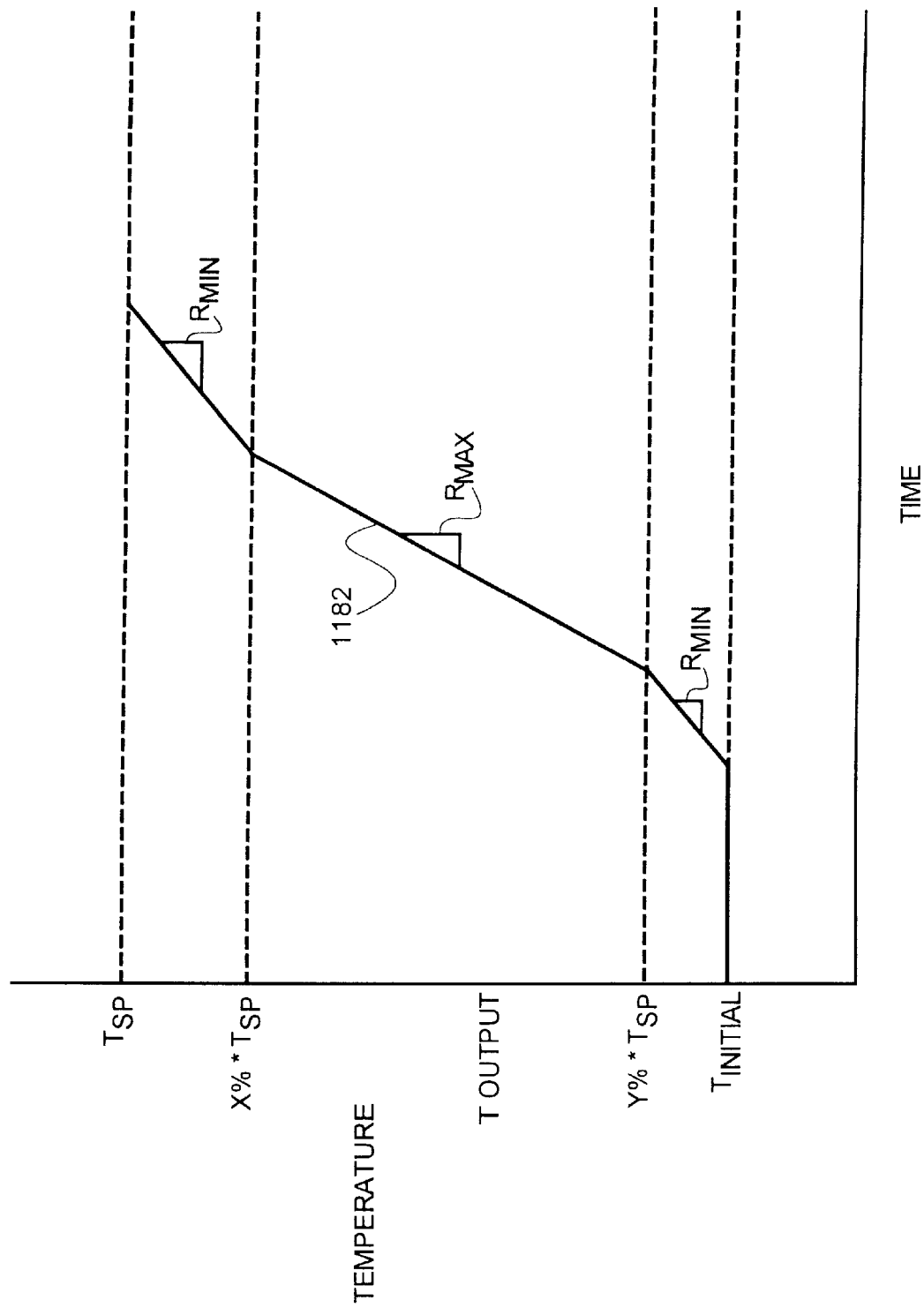
FIG. 8 is a graph illustrating a further embodiment of a modified ramp function that may be applied to the input of the controller of the temperature control system to limit temperature overshoot during a ramp-up temperature phase.

FIG. 8 illustrates a further modified ramp function that may be implemented by the temperature value generator 1145. As shown by function line 1182, the temperature value generator 1145 generates temperature output values, $T_{output}$, that drive the controller 1140 at the minimum ramp rate, $R_{min}$, at a beginning portion of the ramp-up phase. At a predetermined point, such as at a percentage, Y, of the temperature set-point input value, $T_{sp}$, or of the initial temperature value, $T_{initial}$, the temperature value generator 1145 generates temperature output values, $T_{output}$, that drive the controller 1140 at the maximum ramp rate, $R_{max}$. At a further predetermined point, such as at a percentage, X, of the temperatures set-point value, $T_{sp}$, or of the initial temperature value, $T_{initial}$, the temperature value generator 1145 again generates temperature output values, $T_{output}$, that drive the controller 1140 at the minimum ramp rate, $R_{min}$, until the temperature output value reaches the temperature set-point input value, $T_{sp}$. As above, ramp rate switching may alternatively be based on total ramp-up time, user programmed recipe values, predetermined system constants, etc.

Figure 9:
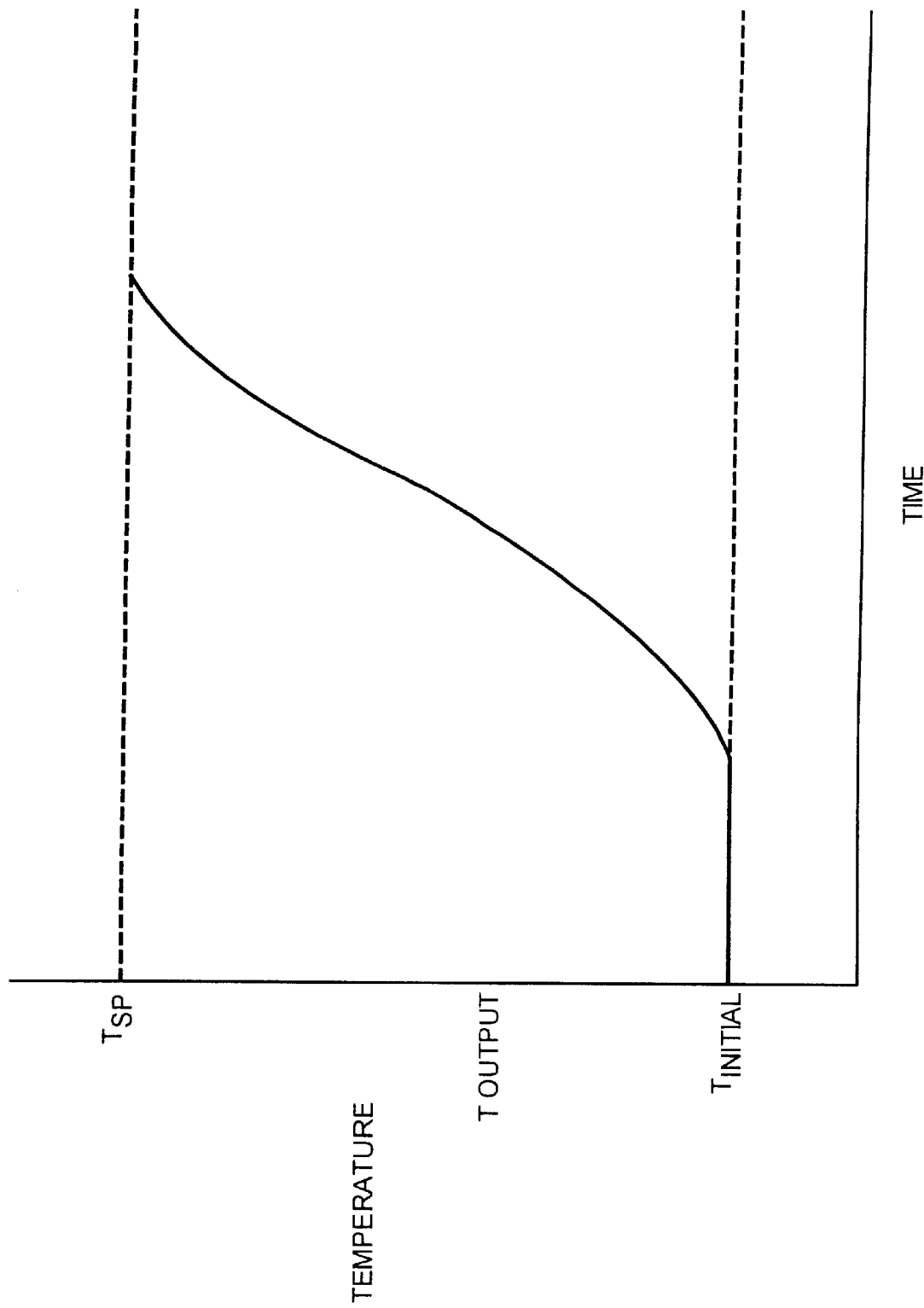
FIG. 9 is a graph illustrating a still further embodiment of a modified ramp function that may be applied to the input of the controller of the temperature control system to limit temperature overshoot during a ramp-up temperature phase.

A further modified ramp-up function that may be implemented by the temperature value generator 1145 is shown in FIG. 9. In this example, the ramp rate, $R_{current}$, used by the controller 1140 varies over the ramp-up phase, but is in no event less than the minimum ramp rate, $R_{min}$. To this end, the ramp rate, $R_{current}$, at a given temperature output value, $T_{output}$, may be described as follows:

$$R_{current} = \frac{T_{target} - T_{output}}{\tau}$$

$$R_{current} = \frac{\partial T_{output}}{\partial \tau}$$

were:

$\tau$ is a time constant (user programmed or system constant); and $$T_{target} = \begin{vmatrix} T_{initial} + R_{max} * t & \text{for } t < \frac{\Delta T}{R_{max}} \\ T_{sp} & \text{for } t \leq \frac{\Delta T}{R_{max}} \end{vmatrix}$$

where:

$T_{sp}$ is the temperature set-point value; and $$\Delta T = |T_{sp} - T_{initial}|.$$

The ramp trajectory is obtained by solving the following system for $T_{sp}$:

$$\frac{dT_{sp}}{dt} = sign(\Delta T)\left\{Max\left(R_{min}, \frac{|T_{input} - T_{sp}|}{\tau}\right)\right\}$$

$$T_{input} = \begin{cases} T_{sp}^{old} + R_{max}t, & t \leq \frac{\Delta T}{R_{max}} \\ T_{sp}^{new}, & t > \frac{\Delta T}{R_{max}} \end{cases}$$

Definitions, $T_{sp}$≡Time dependent set point value that defines the ramp trajectory $$[T_{sp}^{old} \leq T_{sp} \leq T_{sp}^{new} \text{ for all } t]$$

$T_{sp}^{new}$≡New target set point
$T_{sp}^{old}$≡Old target set point
$\Delta T \equiv T_{sp}^{new} - T_{sp}^{old}$
t≡Time variable as measured from start of ramp
$\tau$≡Ramp time constant
$T_{input}$≡Input ramp trajectory that is subsequently filtered If the ramp rate calculation above results in a value that is less than the minimum ramp rate, $R_{min}$, then $R_{current}=R_{min}$ so that a ramp rate used by the temperature value generator is never less than the minimum ramp rate.

As shown in FIG. 9, temperature output values, $T_{output}$, generated in the foregoing manner provide a smoother transition between the minimum and maximum ramp rates used over the duration of the ramp-up phase. Such smooth transitions allow the controller 1140 to more accurately control the temperature of the thermal reactor 12.

Figure 10:
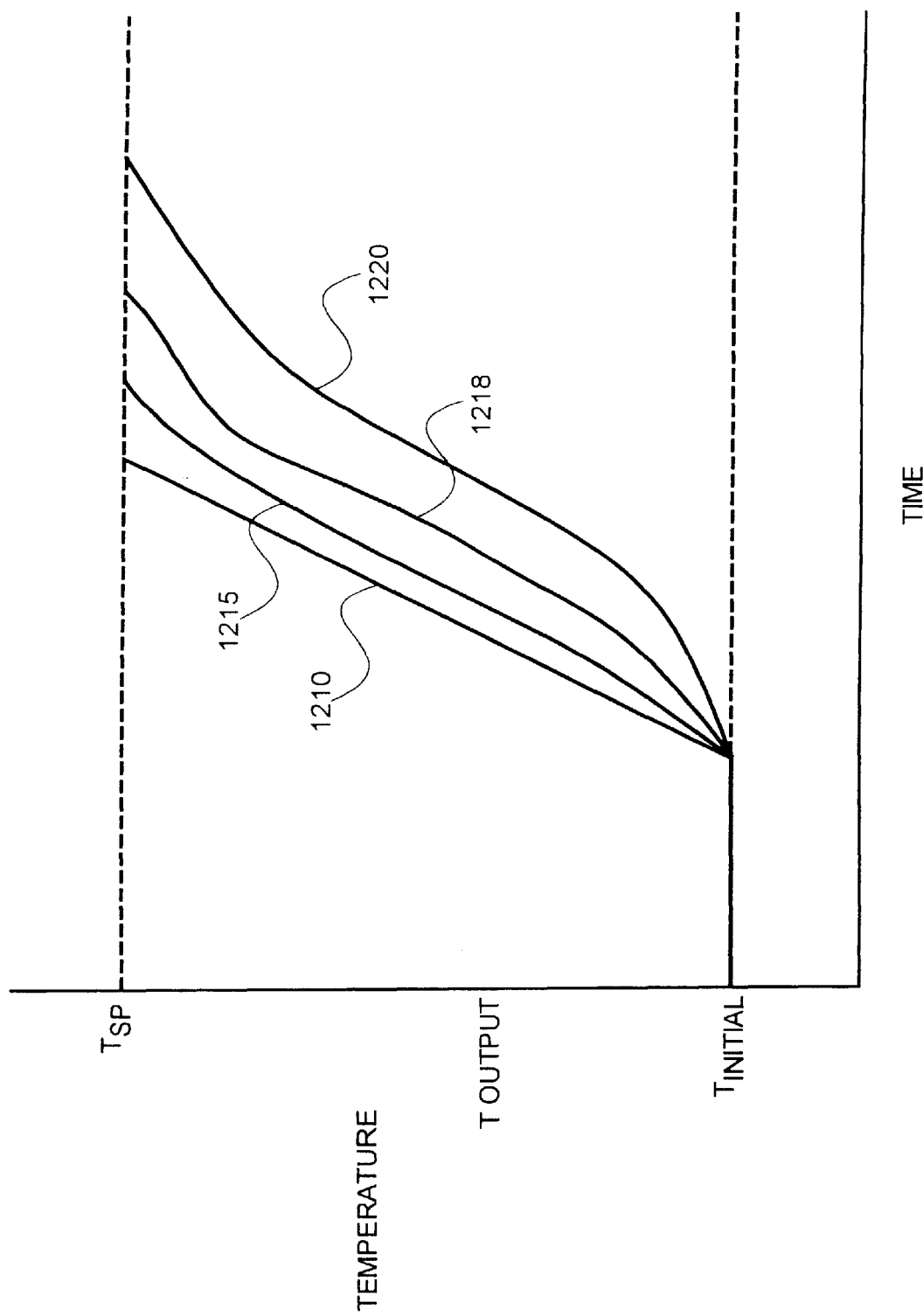
FIG. 10 is a graph illustrating the effects of minimum ramp values on the shape of the curve shown in FIG. 9.

FIG. 10 illustrates the effect of the value of given minimum ramp rate values, $R_{min}$, on the temperature output value, $T_{output}$. In the illustration, line 1210 is a graph of the temperature output values, $T_{output}$, where a large minimum ramp rate, $R_{min}$, is used. Line 1215 is a graph of the temperature output values, $T_{output}$, wherein a minimum ramp rate, $R_{min}$, is used that is less than the minimum ramp rate used to obtain the temperature output values illustrated by line 1210. Similarly, lines 1218 and 1220 represent temperature output values in which even lower minimum ramp rates are used. As can be seen from FIG. 10, a lower minimum ramp rate lengthens the time that it takes to ultimately reach the temperature set-point value, $T_{sp}$, but provides for a smoother transition toward that value thereby reducing and/or eliminating temperature overshoot in the thermal reactor 12. A similar effect results when the time constant, $\tau$, is varied. Larger time constants result in smoother transitions between the minimum and maximum ramp rates and, further, provide for smoother transition as the temperature output value reaches the temperature set-point value, $T_{sp}$.

In addition to temperature overshoot avoidance other advantages of using a nonlinear ramp trajectory include:

1. Better overall control behavior and zone-to-zone matching;
2. Specification of a single trajectory with ramp rates that fall below wafer plastic deformation limits. The alternative may be a cumbersome set of linear ramp segments that are pieced together.

Typically, there is a tradeoff between different control objectives. In a preferred embodiment high bandwidth controllers w/aggressive disturbance rejection properties are chosen (SP changes can be viewed as a disturbance). A linear ramp therefore, can represent a large disturbance that cause aggressive controller response. Nonlinear ramps smooth the disturbance, and also the controller response.

Although the modified ramp functions illustrated in the foregoing environments are directed toward application in a temperature ramp-up phase, it will be recognized that such modified ramp techniques may also be used in a temperature ramp-down phase. When used in a ramp-down phase, one of the goals of the modified ramp operation is to prevent the temperature of the reactor from falling below its newly applied set-point temperature.

TEMPERATURE CONTROL SYSTEM HAVING VIRTUAL TEMPERATURE SENSOR

Figure 11:
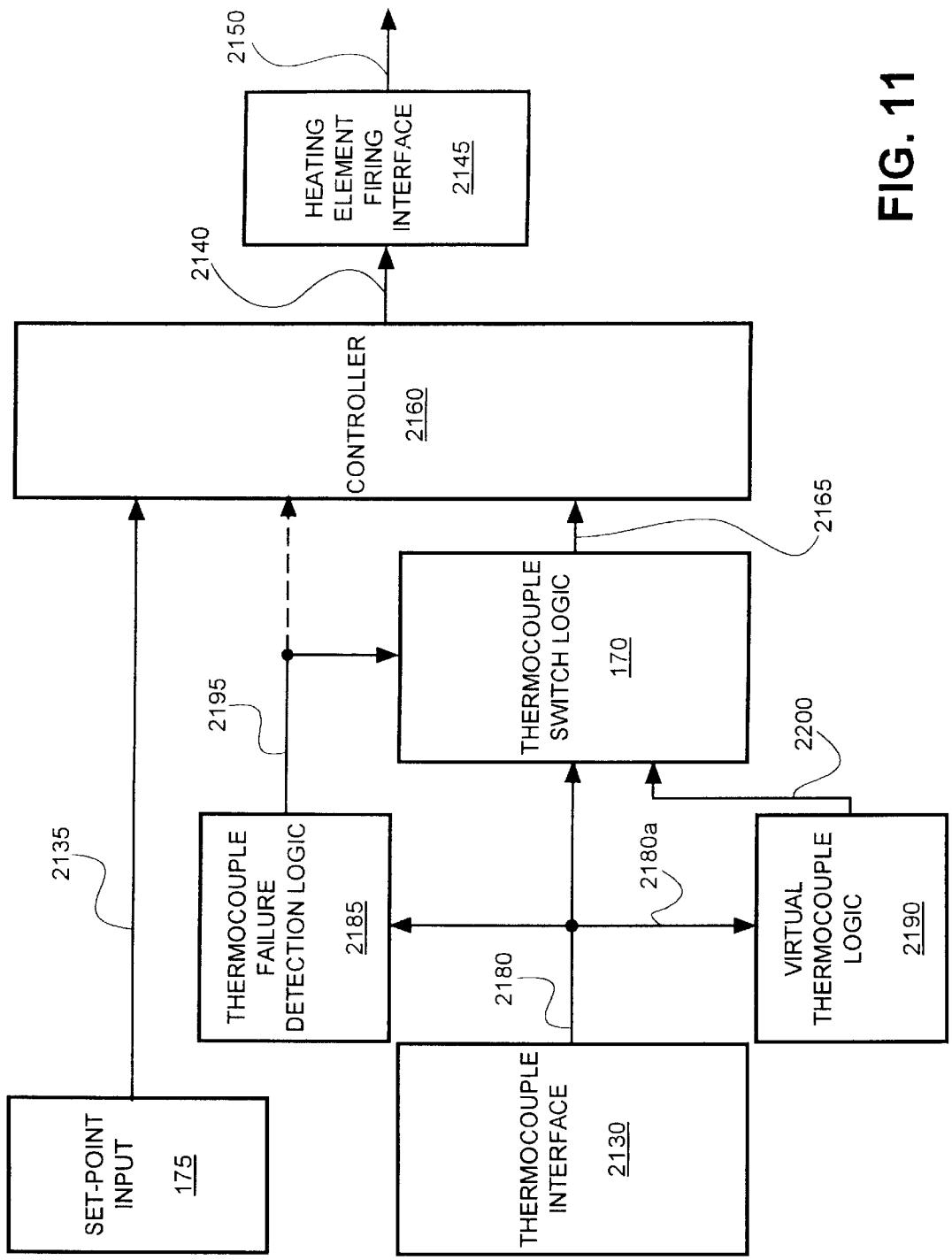
FIG. 11 is a logic flow diagram illustrating operation of one embodiment of a temperature control system having virtual thermocouple logic.

FIG. 11 illustrates one manner of implementing the temperature control system 68 with a virtual temperature sensor. As shown, a controller 2160 is connected to receive a plurality of input data values. The controller 2160 is constructed using robust optimal control theory with empirically derived models of the furnace and workpieces that are to be heated. More particularly, in the illustrated embodiment, the controller 2160 is preferably a multi-variable controller that uses a dynamic model constructed using H-infinity control theory. One manner of deriving the dynamic model used in the controller 140 is set forth in WO98/35531, titled "MODEL BASED TEMPERATURE CONTROLLER FOR SEMICONDUCTOR THERMAL PROCESSORS", which is hereby incorporated by reference. However, it will be recognized that other multi-variable control logic designs may alternatively be used. The control logic flow illustrated in FIG. 11 is thus generally independent of the particular control theory used to design the controller. The only general requirement is that the controller 2160 is capable of executing a dynamic model based on one or more measured variable inputs.

The controller 2160 receives data values represented by line 2165 that correspond to the temperature values as measured by the thermocouples 36, 42. These values are through-connected from the thermocouple interface 2130 through thermocouple switch logic 2170. Additionally, the controller 2160 receives the temperature set-point value at line 2135 from the temperature set-point input, shown logically at 2175, that, for example, is entered by the user as part of the process recipe.

The controller 2160 applies the temperature set-point value provided at 2135 and the thermocouple data values at 2165 to its dynamic model. The controller 2160 uses the input values to generate an output that comprises a plurality of control values that are provided, for example, at the output represented by line 2140 to the input of the heating element firing interface 2145. The firing interface 2145 applies controlled power to the heating element zones at lines 2150 based on the values of the control values to thereby adjust the amount of heat provided in each zone and thus regulating the reactor temperature.

As is readily apparent, a hardware failure that results in an inaccurate reading from a thermocouple will cause the dynamic model of the controller 2160 to arrive at improper solutions for the control output values that are shown logically at line 2140. In conventional practice, the temperature control system is immediately shut down when such failure conditions are detected. In contrast to this conventional practice, the temperature control system of the present invention substitutes a virtual temperature sensor in place of the failed input value to facilitate either continued operation of the reactor in accordance with the programmed recipe or an orderly system shutdown that may minimize the risk of damage to the workpieces.

The embodiment of the control system of FIG. 11 employs at least three logic components to execute the substitution of the virtual temperature sensor in place of the failed input value. To this end, the profile and spike thermocouple values are provided at the output 2180 of the thermocouple interface 2130. These values, in turn, are provided to the input of thermocouple failure detection logic 2185, virtual thermocouple logic 2190, and the thermocouple switch logic 2170.

The thermocouple failure detection logic 2185 monitors the thermocouple data values to detect a change in one or more of the values which is indicative of a hardware failure. Generally, the hardware failure corresponds to a failure of one or more components charged with providing the input value from a particular thermocouple and is not necessarily limited to a failure of the thermocouple itself. Various state changes may indicate such a failure. For example, the thermocouple failure detection logic 2185 may monitor the input values of each thermocouple to determine whether the value exceeds a predetermined upper threshold value or falls below a predetermined lower threshold value. Such limits may indicate an open circuit condition or short circuit condition of the thermocouple or related components. Further, the rate of temperature change indicated by the input values of each thermocouple may be compared to an upper or lower rate threshold value to detect a failure condition of the thermocouple or related components. When a failure of one or more of the thermocouple input values is detected, the detection logic 2185 provides a failure output signal, shown in logic form at 2195 that indicate a failure condition and identifies one or more of the thermocouple inputs that have failed.

The virtual thermocouple logic 2190 also receives the thermocouple data values and uses these values as inputs to a plurality of dynamic thermocouple models, at least one model respectively associated with each thermocouple data value input that is to be provided to the controller 2160 at line 2165. Each dynamic thermocouple model is designed to provide a virtual thermocouple output that accurately tracks what the thermocouple data input to the controller 2140 for a particular thermocouple input would have been if the particular thermocouple input had not been subject to a hardware failure. In the disclosed embodiment, the dynamic model for a particular thermocouple input preferably relates the thermocouple input values for which the model is designed to thermocouple input values from one or more of the other thermocouples used in the control system. In a preferred embodiment in which both spike and profile thermocouples are used by the dynamic model(s) of the controller 2160, only the profile thermocouples are modeled. The virtual thermocouple output values are provided to the input of the thermocouple switch logic 2170, as shown logically by line 2200.

The thermocouple input values shown logically at line 2135 are dependent on the state of the failure output 2195 of the thermocouple failure detection logic 2185. Under As illustrated, the virtual thermocouples logic, shown generally at 2190, receives the spike temperature input values as shown logically by line 2180$a$ to generate virtual profile thermocouple values. The spike temperature input values are provided to the inputs of at least two predicted profile value models 2210 and 2215. Predicted profile value model 2210 is optimized for a temperature range that is higher than the temperature range for which the predicted profile value model 2215 is optimized. The predicted profile thermocouple values of each model 2210 and 2215 are provided to the input of a predicted profile selector 2220. The predicted profile selector 2220 is responsive to one or more input signals indicative of the temperature range in which the thermal reactor is operating or is to operate and selects the appropriate predicted profile values at lines 2225 or 2230 for output at line 2200. In a preferred embodiment, the predicted profile selector 2220 is responsive to a spike temperature input value at line 2180$b$ that is indicative of the temperature sensed by a spike thermocouple that is disposed at a central portion of the thermal reactor 12. If the sensed temperature falls within the optimized range of the high-temperature predicted profile value model 2210, then the predicted profile values at line 2225 are selected for output at 2200. Similarly, if the sensed temperature falls within the optimized range of the low-temperature predicted profile value model 2215, then the predicted profile values at line 2230 are selected for output at 2200. The value of the temperature set-point input at line 2135 (see FIG. 11) may alternatively be provided to the predicted profile selector 2220 and used as a basis for selecting which of the predicted profile value models 2210 or 2215 are optimal under the given conditions. If the value of the temperature set-point input falls within the optimized range of the high-temperature predicted profile value model 2210, then the predicted profile values at line 2225 are selected for output at 2200. Similarly, if the value of the temperature set-point input falls within the optimized range of the low-temperature predicted profile value model 2215, then the predicted profile values at line 2230 are selected for output at 2200.

Figure 12:
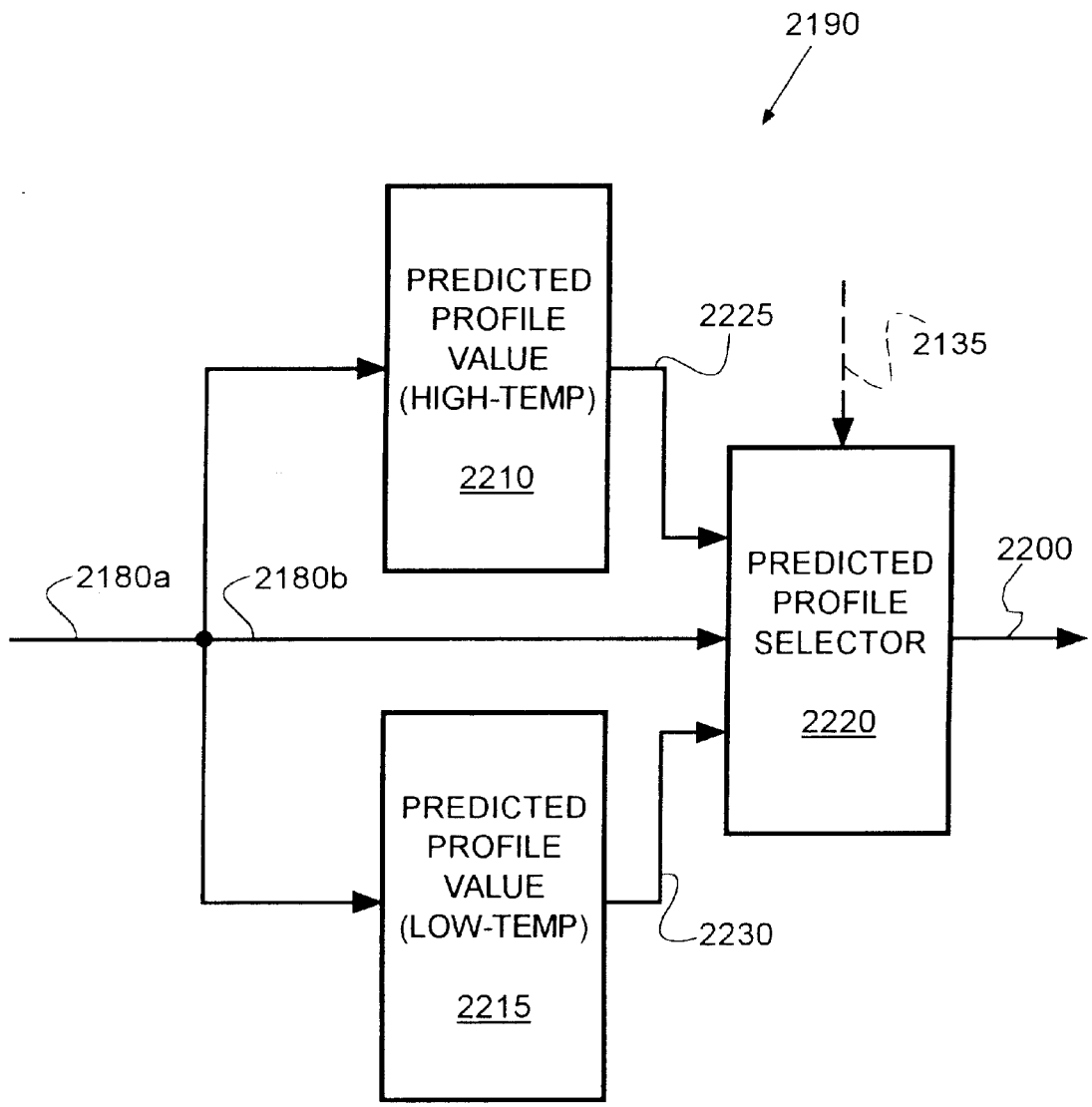
FIG. 12 is a logic flow diagram illustrating one embodiment of the virtual thermocouple logic suitable for use in the overall system illustrated in FIG. 11.

It will be recognized that a wide range of logic architectures other than those set forth in FIGS. 11 and 12 may be used to implement the disclosed virtual temperature sensor substitution system. It is therefore contemplated that all such systems fall within the ambit of the present invention.

HEATING ELEMENT FAILURE CONTROL

The temperature control system 68 controls the temperature within the thermal reactor 12 in accordance with a user programmed recipe. Temperature control is preferably based on dynamic modeling of the thermal reactor 12 in which desired temperature states are modeled based on measurable system parameters. In operation, the recipe comprises temperature set-point values that are used by one or more dynamic models to drive the thermal reactor 12 to the desired temperature state.

Figure 13:
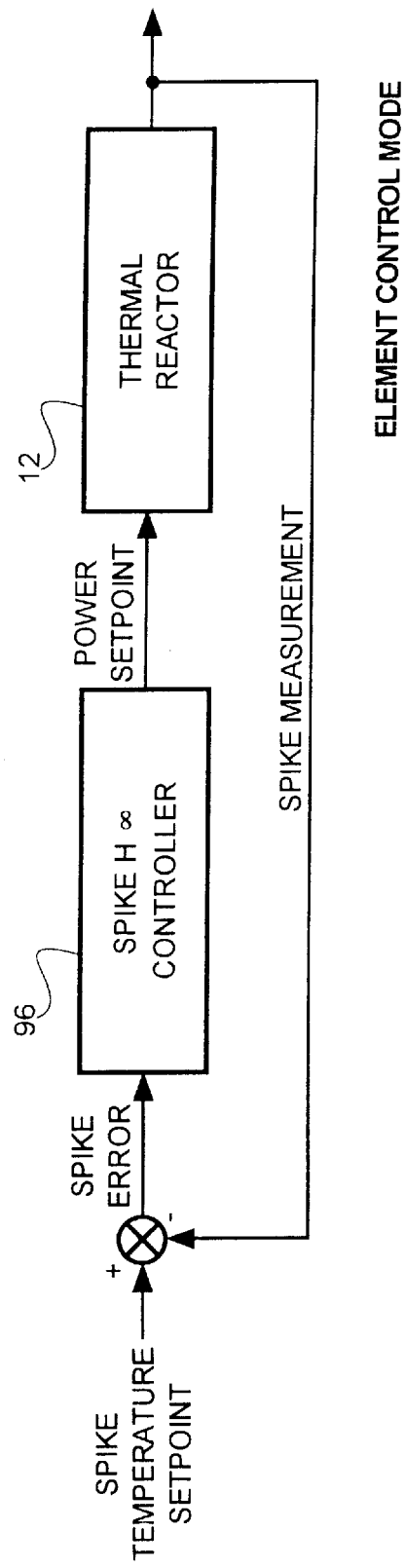
FIG. 13 is a control diagram illustrating one embodiment of an element control mode logic circuit, which employs a spike controller.

With reference to FIG. 13, the temperature control subsystem 68 receives at least two input signals for each predefined heating zone: a profile thermocouple input from which the temperature at the profile thermocouple for the respective heating zone may be determined, and a spike thermocouple input from which the temperature at the spike thermocouple for the respective heating zone may be determined. These profile and spike temperature are provided through a thermocouple interface 3130 as illustrated by line 3215 and are used in conjunction with the temperature set-point input at line 3135 to provide one or more heating element output control values at lines 3140. The output control values at lines 3140 are supplied to the input of a heating elements control interface 3145 and are used to control the electrical power that is supplied at lines 3150 to respective heating zone elements.

A process of designing the controllers 96, 98, 100, and 102 is described in detail in WO98/35531, or titled "MODEL BASED TEMPERATURE CONTROLLER FOR SEMICONDUCTOR THERMAL PROCESSORS", which is hereby incorporated by reference. In the embodiment of the thermal processor disclosed in that application, two types of models are created: off-line and on-line. By "off-line model," what is meant is a model that is created for control system design. By "on-line model," what is meant is a model that is active during the operation of the thermal reactor 12, such as to process actual semiconductor wafers 28.

In the embodiment disclosed in the foregoing application, three off-line models are developed: a power set-point vs. spike thermocouple model; a spike thermocouple vs. profile thermocouple model; and a profile and spike thermocouple vs. thermocouple instrumented wafer model. Each off-line model is used to design the controllers 96, 98, 100, and 102 in the temperature subsystem.

A single on-line model is developed to estimate wafer temperature during operation of the thermal reactor 12. The on-line model predicts the actual temperature of the wafers 28 using real temperature measurements from the spike and profile thermocouples 36 and 42. Because modeling of the entire thermal reactor 12 is complicated and very susceptible to variations and maintenance operations over time, simple modeling of the relationship between the wafer temperatures and the measured profile and spike temperatures is performed to provide an accurate indication of the wafer temperatures during dynamic changes in temperature. Further, it is assumed that under steady-state conditions the profile temperatures are indicative of the actual temperatures of the wafers 28.

After modeling, the three off-line models are used to create three separate and unique controllers: the spike controller 96, the profile controller 98, and the wafer controller 100. The spike controller 96 uses the difference between the spike set-points and spike thermocouple measurements as inputs, and then outputs the power set-points to the firing interface 108. The profile controller 98 uses the difference between the profile set-points and the profile measurements as inputs and then outputs spike set-points to the spike controller 96. The wafer controller 100 uses the difference between the wafer set-points and predictions of the on-line wafer temperature model as inputs and then outputs profile set-points to the profile controller 93. In the illustrated embodiment, each controller 96, 98, and 100 is designed using H-Infinity robust optimal control theory. More particularly, in the illustrated embodiment, each of these controllers are multivariable, in which the interaction between heating zones is taken into consideration to provide improved temperature response to the desired ramp or set-point. It will be readily recognized, however, that other control theories may be used to implement the controllers.

In the illustrated embodiment, a control mode logic circuit is selectable from among different available control mode logic circuits including an element control mode logic circuit (FIG. 13) defining an element control mode, a base control mode logic circuit (FIG. 14) defining a base control mode, a dynamic control mode logic circuit (FIG. 15) defining a dynamic control mode, and a Dt control mode logic circuit (FIG. 16) defining a Dt control mode. Each of these control mode logic circuits are defined by a single one or a combination of the controllers 96, 98, and 100.

Figure 14:
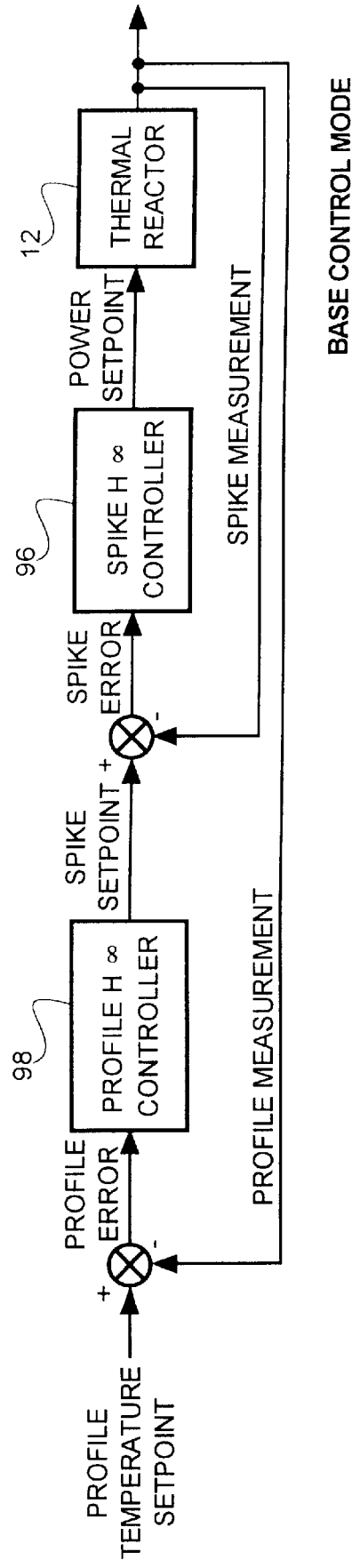
FIG. 14 is a control diagram illustrating one embodiment of a base control mode logic circuit, which employs a profile controller and the spike controller of FIG. 13.
Figure 15:
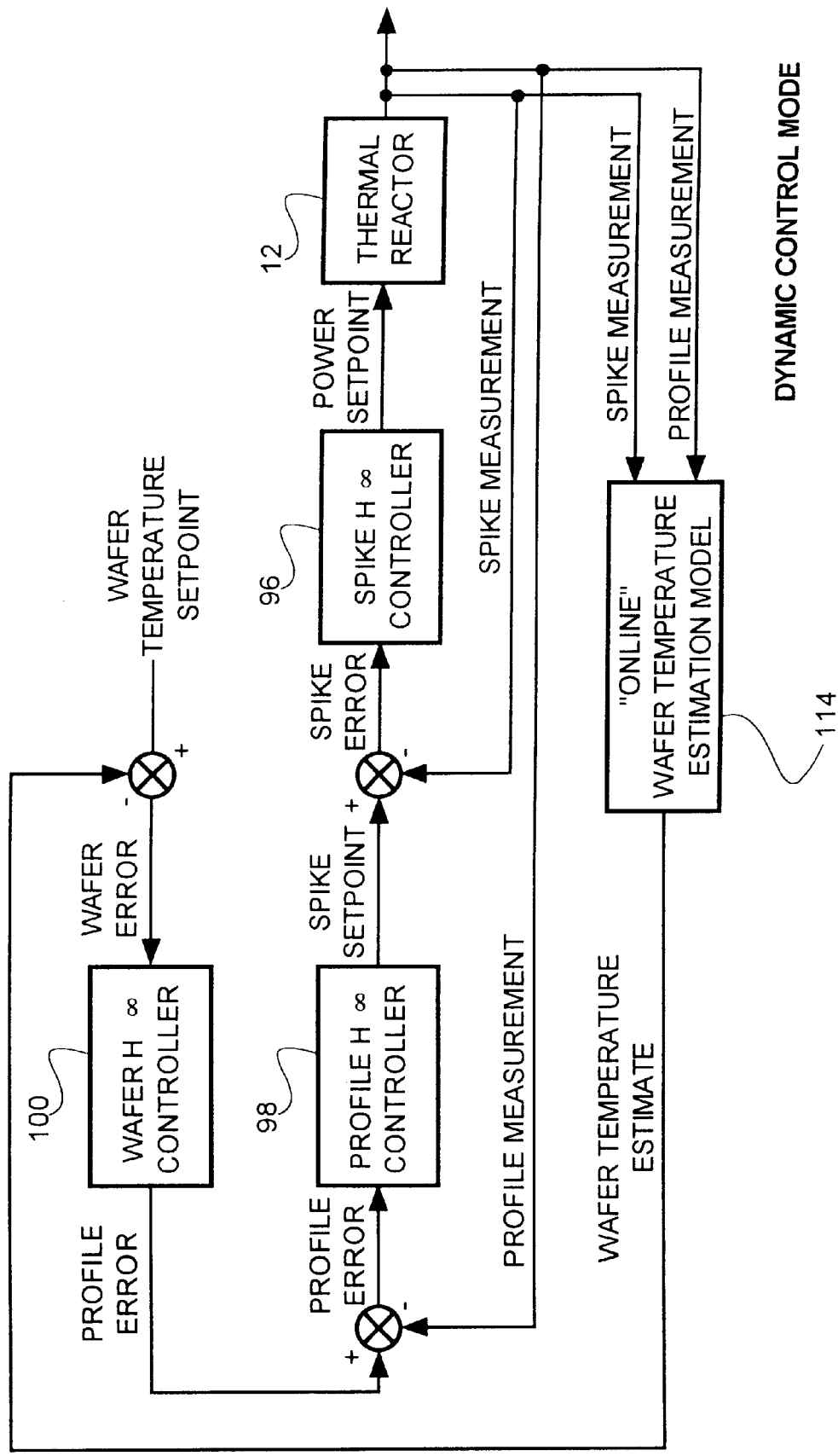
FIG. 15 is a control diagram illustrating one embodiment of a dynamic control mode logic circuit, which employs a wafer controller, the profile controller of FIG. 14, and the spike controller of FIG. 13.
Figure 16:
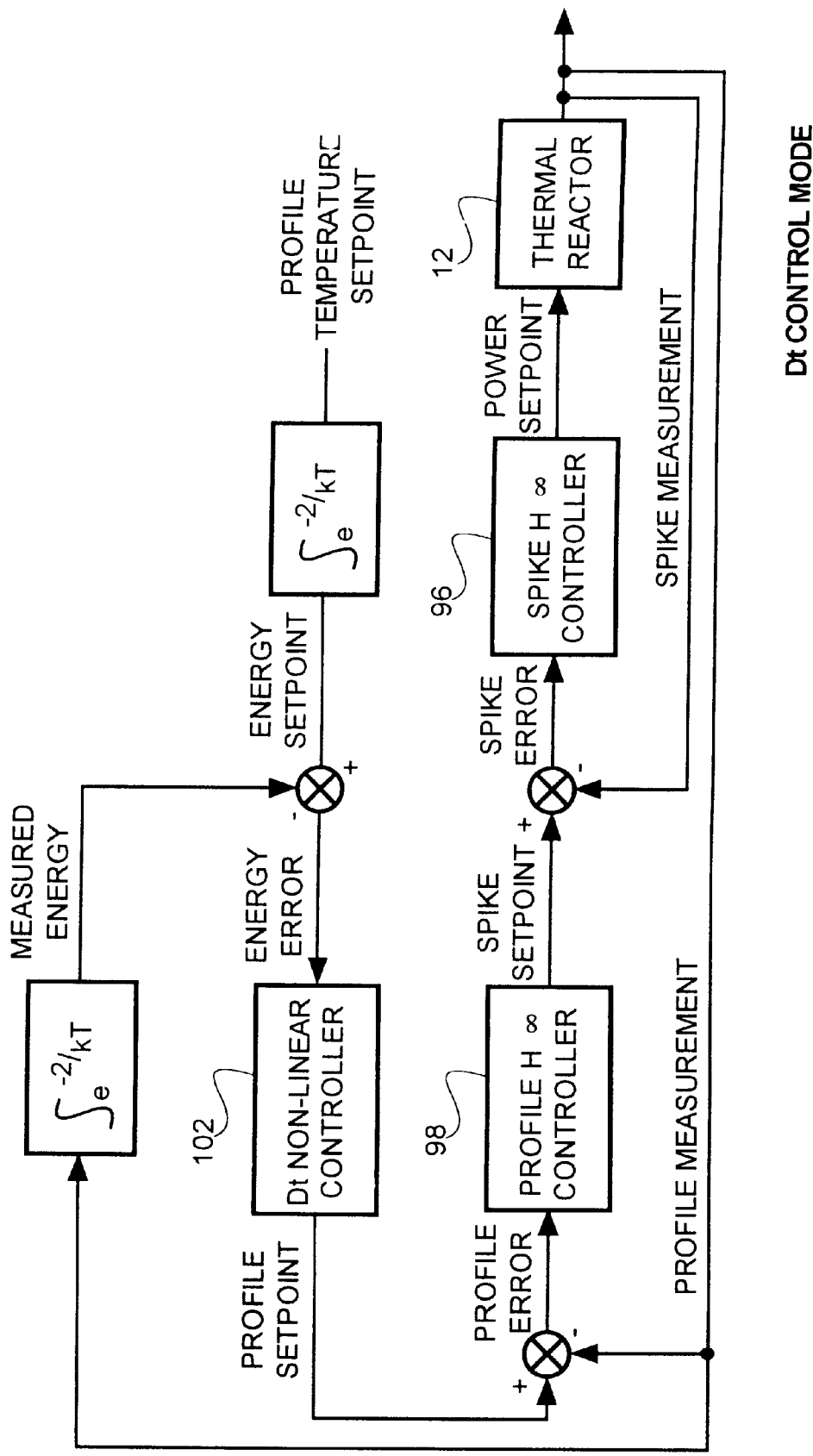
FIG. 16 is a control diagram illustrating one embodiment of a Dt control mode logic circuit, which employs a Dt non-linear controller, the profile controller of FIG. 14, and the spike controller of FIG. 15.

More particularly, the temperature subsystem 68 employs the spike controller 96 for the element control mode (FIG. 13). The temperature subsystem 68 employs a combination of the profile controller 98 and the spike controller % for the base control mode (FIG. 14). The temperature subsystem 68 employs a combination of the wafer controller 100, the profile controller 98, and the spike controller 96 for the dynamic control mode (FIG. 15). Finally, the temperature subsystem 68 employs the non-linear Dt controller 102 with the profile controller 98, and the spike controller 96 to provide the Dt control mode (FIG. 16).

A user can provide a recipe comprising multiple steps and which uses any one of the control modes in each step. For example, a user can provide a recipe that switches from one control mode to another at a given stage of semiconductor processing. One suggested approach is to employ the base control mode during a furnace check and push in of the boat 18, prior to a ramp up in temperature, to employ the wafer control mode during temperature ramp up and temperature stabilization, to employ the Dt control mode during wafer processing steps, and to employ the base control mode during boat push out. Another suggested approach is to use the base control mode during all processing steps.

The element control mode is typically a maintenance mode (e.g., to burn in elements). In the element control mode, the spike controller controls on the basis of spike thermocouple temperatures. The mode is not used in normal processing of wafers.

The base control mode (FIG. 14) is the default mode of operation, and is the mode with which there is a concern with respect to heating element failure. In the base control mode, the profile controller 98 provides a spike set-point control signal based on a profile error. The profile error is based on the difference between profile temperature set-point, and profile temperature measurements by the profile thermocouples 42. The spike controller 98 controls power to the thermal reactor based on spike error. The spike error is based on the difference between spike set-point and spike temperature measurements by the spike thermocouples 36.

The base control mode provides accurate control resulting in improved process uniformity and cycle time reduction attributed to faster stabilization times. The base control mode logic circuit uses the profile and spike controllers simultaneously by cascading them together.

As illustrated in FIG. 2, one or more heating element failure signals are provided to the controller 68 from heating element failure logic, shown generally at 101. The heating element failure signals, illustrated in logic form at line 103 are indicative of a failure of a particular heating element in one of the predefined heating zones. Such failures can be detected in any number of manners. For example, the derivative of the measured spike thermocouple values that are provided for a particular heating zone over time may be monitored to detect a failure. When the absolute value of the derivative exceeds a predetermined threshold value for a particular spike thermocouple, it may indicate a failure of the corresponding heating element for the zone. A heating element failure signal may then be generated to the controller 68 indicating a failure of the corresponding heating element.

Another manner of detecting a heating element failure is to measure the difference between the spike set-point value and the temperate as measured by the spike thermocouples. If the difference exceeds a predetermined threshold value in a particular zone, it may be used to indicate a failure of the corresponding heating element for that zone.

A still further manner of detecting a heating element failure is to measure the current flowing through the heating element or the voltage across the heating element for a particular heating zone. If the current falls below a predetermined threshold value for a particular heating element, it may indicate a failure of the heating element. Similarly, if the voltage across the particular heating element exceeds a predetermined threshold value, it may indicate a failure of the heating element.

When the controller 68 detects a heating element failure in one or more zones, the controller 68 switches to the element control mode shown in FIG. 13. Further, while in this element control mode, the spike set point is lowered for the heating zone in which the heating element failure occurred. Preferably, the spike set point for the failed zone is dropped with the measured value of the spike thermocouple 36.

Handling of the heating element failure in this manner has several advantages. For example, such failure handling prevents erratically high temperatures from occurring when the heating element recovers from the failure and power is restored. This assists in preventing wafer slip that may otherwise occur through temperature overshoot if the heating element is immediately driven to the set point value upon recovery from the failure condition Further, such failure handling prevents the re-occurrence of an over-temperature condition that may otherwise occur through temperature overshoot. Still further, such failure handling makes salvaging do workpieces 28 possible despite the heating element failure.

Profile thermocouples do not match temperatures at the edge of a load. Users prefer not to change their recipes to compensate for this. One solution to this problem is to shorten profile thermocouples which results in readings generated by the profile thermocouples more accurately matching temperatures at the edge of a load. The dynamic or wafer control mode (FIG. 15) provides a solution to the problem without requiring modification of the profile thermocouples or adjustment of the user's recipe.

In the dynamic control mode, the wafer controller 100 provides prediction or estimation of the temperatures of wafers 28 and control to achieve temperatures for the wafers 28 which approach the desired or recipe wafer temperatures. The dynamic control mode may be most advantageously employed during temperature ramping and stabilization steps. The dynamic control mode involves the prior use of the thermocouple instrumented wafers 44 during modeling, as discussed above. After modeling, while the control system is in use, the dynamic control mode controls the thermal reactor 12 based on predicted wafer temperature using the on-line wafer temperature estimating model 114. The on-line wafer temperature estimation model 114 predicts wafer temperature based on measurements from the spike and profile thermocouples 36 and 42. More particularly, wafer temperature is predicted based on measurements from the spike and profile thermocouples 36 and 42 and the relationship between measurements taken by the thermocouple instrumented wafers 44 (representing wafer temperature) and measurements taken by the profile and spike thermocouples 36 and 42 during modeling.

In the dynamic control mode, the wafer controller 100 provides a profile set-point based on a wafer error. The wafer error is based on the difference between profile temperature set-point, and profile temperature measurements by the profile thermocouples 42. The profile controller provides a spike set-point control signal based on profile error. The profile error is based on the difference between profile temperature set-point produced by the wafer controller 100, and profile temperature measurements by the profile thermocouples. The spike controller controls power to the thermal reactor based on spike error. The spike error is based on the difference between spike set-point and spike temperature measurements by the spike thermocouples 36. The dynamic control mode uses the spike controller 96, the profile controller 98, and the wafer controller 100 cascaded together.

In the Dt or thermal budget mode, the Dt controller 102 measures temperature exposure or applied thermal energy and controls energy with respect to set-point or desired energy. Thermal budget is controlled, using measurements from profile thermocouples 42 and taking the integral of $e^{(-2/kT)}$ where k is Boltzmann's constant and T is temperature measured using the profile thermocouples 42, to maintain Dt values in accordance with desired energy. A calculation is made of energy sent into the thermal reactor, and energy sent into the thermal reactor is controlled. The thermal budget mode is advantageously used to control thermal budget during critical processing steps to maintain consistent Dt values both down the load and run-to-run.

In the Dt control mode (FIG. 8), the Dt controller 102 provides a profile set-point based on an energy error. The energy error is based on the difference between an energy set-point, and measured energy. The profile controller 98 provides a spike set-point control signal based on a profile error. The profile error is based on the difference between profile temperature set-point produced by the Dt controller, and profile temperature measurements by the profile thermocouples 42. The spike controller 96 controls power to the thermal reactor based on spike error. The spike error is based on the difference between spike set-point and spike temperature measurement by the spike thermocouples 36.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A temperature control system for controlling the temperature of a thermal reactor, the temperature control system comprising:
   a first temperature controller that is optimized for computing a first set of control output values over a first temperature range;
   a second temperature controller that is optimized for computing a second set of control output values over a second temperature range, the first temperature range being different than the second temperature range; and
   control output selection logic for determining which of the first or second set of control values is used to control the temperature of the thermal reactor.

2. A temperature control system for controlling the temperature of a thermal reactor, the temperature control system comprising:
   a first temperature controller that is optimized for computing control output values over a first temperature range;
   a second temperature controller that is optimized for computing control output values over a second temperature range, the first temperature range being different than the second temperature range; and
   an observer gain feedback system for driving the control values of the first temperature controller toward the control values of the second temperature controller when the second set of control values is used to control the temperature of the reactor, and for driving the control values of the second temperature controller toward the control values of the first temperature controller when the first set of control values is used to control the temperature of the reactor.

3. A temperature control system for controlling the temperature of a thermal reactor, the temperature control system comprising:
   a first temperature controller applying a first dynamic model to a plurality of measured input parameters to generate a first set of control values, the first dynamic model being optimized over a first temperature range to provide generally optimal values for the first set of control values over the first temperature range;
   a second temperature controller applying a second dynamic model to a plurality of measured input parameters to generate a second set of control values, the second dynamic model being optimized over a second temperature range to provide generally optimal values for the second set of control values over the second temperature range, the first temperature range being different than the second temperature range; and
   control output selection switch logic for determining which of the first or second set of control values is used to control the temperature of the thermal reactor.

4. A temperature control system for controlling the temperature of a thermal reactor, the temperature control system comprising:
   a first temperature controller applying a first dynamic model to a plurality of measured input parameters to generate a first set of control values, the first dynamic model being optimized over a first temperature range to provide generally optimal values for the first set of control values over the first temperature range;
   a second temperature controller applying a second dynamic model to a plurality of measured input parameters to generate a second set of control values, the second dynamic model being optimized over a second temperature range to provide generally optimal values for the second set of control values over the second temperature range, the first temperature range being different than the second temperature range; and
   an observer gain feedback system for driving the first set of control values toward the second set of control values when the second set of control values is used to control the temperature of the reactor, and for driving the second set of control values toward the first set of control values when the first set of control values is used to control the temperature of the reactor.

* * * * *